United States Patent [19]
Eiraku et al.

[11] Patent Number: 5,969,529
[45] Date of Patent: Oct. 19, 1999

[54] ELECTRONIC APPARATUS HAVING BATTERY POWER SOURCE

[75] Inventors: Tetsuhiko Eiraku; Shunji Takakura, both of Nara, Japan

[73] Assignee: Sharp Kabushiki Kaisha, Osaka, Japan

[21] Appl. No.: 08/813,205

[22] Filed: Mar. 7, 1997

[30] Foreign Application Priority Data

Mar. 14, 1996 [JP] Japan ..................................... 8-057510
Mar. 29, 1996 [JP] Japan ..................................... 8-077924

[51] Int. Cl.$^6$ ......................... G01N 27/416; G01R 31/36
[52] U.S. Cl. .......................... 324/433; 324/429; 320/136
[58] Field of Search .................................... 324/426, 427, 324/429, 433; 320/135, 136; 361/18

[56] References Cited

U.S. PATENT DOCUMENTS

| | | | |
|---|---|---|---|
| 5,061,898 | 10/1991 | Oram et al. | 324/427 |
| 5,416,416 | 5/1995 | Bisher | 324/426 |
| 5,583,440 | 12/1996 | Bisher | 324/426 |
| 5,773,961 | 6/1998 | Cameron et al. | 320/132 |

FOREIGN PATENT DOCUMENTS 1-94493  4/1989  Japan .
5-52914  3/1993  Japan .

*Primary Examiner*—Glenn W. Brown
*Attorney, Agent, or Firm*—Nixon & Vanderhye, P.C.

[57] ABSTRACT

A voltage monitoring circuit (4) detects when the output battery of a power source (e.g., battery) falls below a predetermined reference voltage. A controller (3), in response to the monitoring circuit, performs a load operation. In the load operation, a switch (8-1) in a pseudo-load circuit 8 is operated to connect a dummy load (8-2). On the basis of the output voltage of the power source when the dummy load is operable, the controller determines whether to allow a further drain on the power supply, e.g., connection of a peripheral device interface (10). In one embodiment, the pseudo-load circuit 8 has plural dummy loads which can be invoked to determine with which of plural possible loads (e.g., peripheral devices) the power source can be utilized. Also disclosed are both digital and analog methods and circuits for determining utilizable load magnitude by gradually raising power supply capacity. The invention solves numerous problems, including combatting an inrush current which can be produced when a card (such as a PCMCIA card) is inserted into an electronic apparatus such as a personal digital assistant.

17 Claims, 19 Drawing Sheets

THE LARGER THE NUMBER OF CONTROL SIGNAL,
THE MORE FINELY CONTROL IS CONDUCTED

VOLTAGE BETWEEN
SOURCE AND GATE

ON RESISTANCE
OF FET

CURRENT SUPPLY
CAPACITY and 5,969,529

ELECTRONIC APPARATUS HAVING BATTERY POWER SOURCE

BACKGROUND OF THE INVENTION

1. Field of the Invention

The present invention relates to an electronic apparatus having a battery power source, for example, a portable information terminal such as a PDA (Personal Digital Assistant), a PC (Personal Computer), or a PHS (Personal Handyphone System), or a portable game machine to which a function can be added by a peripheral device such as a memory card, or a modem which is driven by a primary or secondary battery.

The present invention relates also to an electronic apparatus, and particularly to a configuration wherein a power is supplied from a battery to a card-like electronic part such as a PCMCIA (Personal Computer Memory Card International Association) card which is attached to the electronic apparatus and on which an electronic circuit is mounted.

2. Description of the Related Art

FIG. 21 is a diagram showing the configuration of a prior art electronic apparatus which comprises a usual power source circuit having a voltage monitoring circuit for a battery. Referring FIG. 21, the voltage of the battery 1 is boosted by a boost circuit 2 and a stable driving voltage is supplied to the system main unit 3 of the electronic apparatus. A voltage monitoring circuit 4 detects a voltage which appears immediately before the capacity of the battery 1 is reduced to reach the operating limit of the system main unit 3 of the electronic apparatus, and warns the system 3.

FIG. 22 shows the flow of a process of checking the battery which is conducted when the electronic apparatus of FIG. 21 is activated. The power source circuit is turned on at step S1, and the system main unit 3 is initialized at step S2. The voltage monitoring circuit 4 detects at step S3 the voltage of the battery 1, and compares at step S4 with the detected voltage with a preset reference voltage.

If the detected voltage is higher than the reference voltage, the process proceeds to step S6 in which the process waits for a start of a computer program application. If the detected voltage is equal to or lower than the reference voltage, the process proceeds to step S5. At step S5, it is judged that the voltage reaches the warning level and a process of driving a warning sign 14 which warns the user is conducted.

The processes of steps S1 to S3 are conducted by the voltage monitoring circuit 4 shown in FIG. 21, so that the voltage just above that which is the operating limit at activation of the system main unit 3 of the electronic apparatus is detected and a detection signal a is output. In response to the detection signal a, the system main unit 3 causes an interruption in the program and performs the process of driving the battery warning sign 14 such as a display of a battery warning mark, a display of a message requesting replacement of the battery, or emission of an alarm sound.

FIG. 23 shows the flow of a process of improving the state of the power source in the prior art apparatus of FIG. 21. When the voltage monitoring circuit 4 of FIG. 21 detects that the voltage of the battery is equal to or lower than the reference voltage of a value just above the operating limit of the system main unit 3, the battery warning sign 14 is displayed at step S7 and it is checked at step S8 whether the battery is to be replaced or not.

When the battery is to be replaced, the power is turned off. When the battery is not to be replaced, the process proceeds to step S9 in which it is judged whether the power supply is switched to an external power source or not. When the power supply is switched to an external power source, the display of the battery warning sign is turned off. In other words, the battery warning sign 14 is continued to be displayed until replacement of the battery or start of the power supply from an external power source such as an AC adaptor is conducted at steps S8 and S9.

FIG. 24 shows the flow of a process in the case where the state of the power source is returned in the prior art apparatus of FIG. 21. Referring to FIG. 24, if it is judged at step S10 that the battery is to be replaced, the power is once turned off and the battery is replaced with a fresh one. Thereafter, the power is again turned on. Because of the power-off due to the battery replacement, therefore, no power is supplied to the system main unit 3 and the so-called manual cancellation is performed. Consequently, after the battery replacement is done, the system main unit 3 is again initialized. When the power supply is switched to an AC adaptor which is an external power source, an input from an external power source terminal 15 is detected at step S11. When the recovery of the voltage due to the external power source is detected, the display of the battery warning sign 14 is turned off.

As described above, in the power source circuit of the prior art, the voltage monitoring circuit 4 measures merely the terminal voltage of a battery, and, when the terminal voltage is equal to or lower than the preset reference voltage, the battery replacement warning is given. According to such a configuration, information of the state of the battery cannot be obtained unless the voltage of the battery is lowered to the preset warning level of the system main unit 3. In other words, there is a problem in that, even when the terminal voltage of a battery reaches a reference level, it is impossible to obtain information regarding the magnitude of the load which can be driven by the remaining capacity of the battery.

The prior art apparatus has another problem as follows. In the case where the voltage of a battery is lowered to a level which is equal to or lower than the preset warning level, when an operation involving a large load, such as access of a peripheral device 16 is conducted, the voltage of the battery is further lowered, resulting in that the system main unit 3 falls into a disfunctional state and data which are currently produced in the system main unit 3 disappear.

The prior art apparatus has a further problem in that, when the state of the power source is improved as a result of replacement of a battery, connection to the AC adaptor, or the like, a special operation must be performed on the electronic apparatus and the user is required to perform a special operation such as initialization of the system main unit 3 or restart of the apparatus.

FIG. 25 is a circuit diagram illustrating a prior art electronic apparatus to which a PCMCIA card can be attached. In the figure, 200 designates an electronic apparatus having a slot 200a to which a PCMCIA card 201 is to be attached. The electronic apparatus 200 has an external power source terminal 200b to which an external power source is to be connected through an AC adaptor or the like, and is configured so as to incorporate a battery. The power supply to the PCMCIA card 201 is performed also by a battery 202.

The electronic apparatus 200 comprises a CPU (Central Processing Unit) 200a which performs required calculation processes, a ROM (Read-Only Memory) 200b which stores programs for the calculation processes and the like, and another functional circuit 200c. These components are configured in the form of an LSI chip. The apparatus 200 further comprises a boost circuit 220 which generates a voltage (5 V) required for operating the LSI chips such as the CPU 200a and the ROM 200b.

A diode (D3) 225 is forward connected between the external power source terminal 200b and the boost circuit 220, and another diode (D2) 224 is forward connected between the battery 202 and the boost circuit 220.

The boost circuit 220 comprises a coil (L1) 222 one end of which is connected to the cathodes of the diodes 224 and 225, a diode (D1) 223 the anode of which is connected to the other end of the coil 222, and a power source IC 221 which is connected between the ends of the diode 223 and the ground.

The output of the boost circuit 220 is connected to the slot 200a through a switching element 211 composed of a field effect transistor FET1. When the electronic apparatus 200 is powered on, the gate input PC of the switching element 211 reaches the on-level of the transistor FET1 and the power is supplied to the PCMCIA card 201 through the switching element 211.

However, the prior art electronic apparatus to which a PCMCIA card can be attached and which is configured as described above has the following problems.

In the prior art electronic apparatus 200, although a wide variety of PCMCIA cards which are largely different in level of the operation current are used., the power supply is conducted on any kind of PCMCIA card in the same manner. In the case where the remaining capacity of the battery of the electronic apparatus is insufficient or where a PCMCIA card requiring a driving current exceeding the load driving capacity of the battery is to be driven, when a PCMCIA card is connected to the battery, therefore, a current of a level required for driving the card momentarily flows through the card. Such a momentary current may adversely affect the electronic apparatus, with the result that the electronic apparatus is caused to run away or the LSIs and the like incorporated in the electronic apparatus are broken in some cases.

When a modem card requiring a large operating current is attached to the electronic apparatus incorporating a battery which is in the last stage of the life (where there is only small capacity, for example), the power source voltage (5 V) which is necessary for the CPU, the ROM, etc. mounted on the electronic apparatus, and also the PCMCIA card to operate, cannot be secured. This may cause the electronic apparatus to malfunction.

In many electronic apparatuses, as described above, in addition to a power supply using a battery, also an external power supply using an AC adaptor can be utilized. Even when the remaining capacity of the battery is insufficient for the electronic apparatus to operate, such an electronic apparatus is enabled to operate normally by the external power supply.

Assume a case where such an electronic apparatus is operated by the external power supply and the remaining capacity of the battery is insufficient for the electronic apparatus to operate. In such a case, when the external power supply is stopped by a power failure or the like, there arises a problem in that the apparatus malfunctions because of the insufficient remaining capacity of the battery.

Japanese Unexamined Patent Publication JP-A 1-94493 (1989) discloses an ID card which may be used as an article management card in a production line and which comprises a built-in battery, a data processing circuit driven by the battery, and a transmission circuit for conducting communication between the data processing circuit and an external apparatus. In the ID card, when the output voltage of the battery is lowered to a predetermined voltage reduction detection level, the external apparatus is informed of the reduction of the output level of the battery. This prevents a stop of the operation of the ID card due to the phenomenon that the output level of the battery is lowered to the malfunction level of the ID card, from occurring during a period when the production line is operating.

However, the technique disclosed in the publication is to detect the reduction of the output level of the battery in the ID card and prevent the ID card from malfunctioning, and is not directed to an electronic apparatus to which various PCMCIA cards of different driving currents can be attached and which drives the attached card. Therefore, the disclosed technique cannot solve the problems caused in such an electronic apparatus by an inrush current which, when a power source is connected to a PCMCIA card, is produced because of the reduction of the voltage driving the PCMCIA card or a difference in level among driving currents of cards.

The present invention solves the foregoing problems. It is an object of the invention to provide an electronic apparatus in which an inrush current (produced when a card-like electronic part such as a PCMCIA card is attached to the body of the electronic apparatus and connected to a battery disposed in the body) can be suppressed, whereby runaway of the apparatus and breakage of the internal circuit due to the inrush current are prevented from occurring.

It is another object of the invention to provide an electronic apparatus in which, even when an external power supply is stopped by a power failure or the like under a state where the apparatus is operated by the external power supply, malfunction of the apparatus due to an insufficient remaining capacity of a battery can be prevented from occurring.

SUMMARY OF THE INVENTION

In order to solve the problems, the invention provides an electronic apparatus having a battery power source comprises:

power source means for deriving electric power from a primary or secondary battery;

voltage monitoring means for detecting that an output voltage of the power source means is lowering to a predetermined reference voltage or less;

controlling means for responding to an output of the voltage monitoring means, and, when the output voltage of the power source means detected by the voltage monitoring means has lowered to the reference voltage or less, controlling a load operation;

dummy load means;

switching means for selectively causing the dummy load means to operate; and load information detecting means for obtaining information of a load, which can be connected to the power source means when the electronic apparatus is powered on, on the basis of the output voltage of the power source means which is detected by the voltage monitoring means when the dummy load means operates.

Accordingly, when a load is to be connected to the power source means composed of a primary or secondary battery, the switching means is turned on before the connection of the load. When the switching means is turned on, the dummy load means is connected to the power source means, and the output voltage of the power source means has a value attained in the state where the dummy load means is connected to the power source means.

The voltage monitoring means detects the output voltage of the power source means to which the dummy load means is connected, and compares the voltage with the predetermined reference voltage. The load information detecting means obtains information of a load which can be connected to the power source means when the electronic apparatus is powered on. In this case, the reference voltage is preset so as to be equal to a minimum voltage which is required for the load connected to the power source means to normally operate when the electronic apparatus is powered on. Accordingly, before the connection of the load is executed, the load information detecting means can detect by using the dummy load whether the apparatus can normally operate or not when the load is connected to the apparatus.

Further the invention is characterized in that:

the dummy load means is composed of a plurality of dummy loads;

switching means for selectively connecting the respective dummy loads to the power source means is provided;

the voltage monitoring means detects the output voltage of the power source means at a timing when the respective dummy loads are connected to the power source means; and the load information detecting means derives a signal for selecting a load which can be connected to the used power source means, on the basis of the output voltage of the power source means with respect to each dummy load, which is detected by the voltage monitoring means.

According to the invention, when a load is to be connected to the power source means composed of a primary or secondary battery, the plurality of dummy loads are sequentially connected to the power source means by the switching means before the connection of the load is executed. The voltage monitoring means detects the output voltages of the power source means in the states where the plurality of dummy loads are sequentially connected to the power source means. The output voltages are compared with a predetermined reference voltage. The load information detecting means obtains information of a plurality of loads which can be connected to the power source means when the electronic apparatus is powered on.

In this case, the reference voltage is preset so as to be equal to a minimum voltage which is required for the plurality of loads connected to the power source means to normally operate when the electronic apparatus is powered on. Since the plurality of dummy loads are used, it is possible to more accurately judge which load can be connected. Before the connection of the plurality of loads is executed, furthermore, the load information detecting means can detect whether the remaining capacity of the battery is sufficient for the apparatus to normally operate when the plurality of loads are connected to the apparatus or not.

Further the invention is characterized in that:

the apparatus further comprises:

peripheral device interface means which is coupled to a body of the electronic apparatus through a signal line composed of an address line and a data line; and connecting means for selectively connecting the power source means to a peripheral device through the peripheral device interface means, and on the basis of load information detected by the load information detecting means, which load information indicates that a peripheral device can be connected to the peripheral device interface means, the controlling means controls the connecting means so that a voltage is supplied from the power source means to the peripheral device.

When a peripheral device is to be connected to the peripheral device interface means which is coupled to the body of the electronic apparatus through the signal line composed of an address line and a data line, therefore, the dummy load corresponding to the peripheral device is previously connected to the power source means, and the load information detecting means detects whether the peripheral device can be connected or not.

In the case where the load information detecting means determines that the peripheral device can be connected, the controlling means controls the connecting means for selectively connecting the power source means to the peripheral device so that the power source means is connected to the peripheral device. When the remaining capacity of the battery constituting the power source means is reduced and the load information detecting means determines at the time of checking by the dummy load that the peripheral device cannot be connected, the controlling means controls the connecting means so that the power source means is not connected to the peripheral device.

Further the invention is characterized in that:

the apparatus further comprises:

peripheral device interface means including a plurality of peripheral device interfaces which are coupled to a body of the electronic apparatus through a signal line composed of an address line and a data line; and connecting means for selectively connecting the power source means to a plurality of peripheral devices through the corresponding plural peripheral device interfaces, and on the basis of load information detected by the load information detecting means, the controlling means judges with respect to each of the peripheral device interfaces whether the corresponding peripheral devices can be connected to the peripheral device interfaces or not, and controls the connecting means so that a voltage is selectively supplied from the power source means to such a peripheral device of the peripheral devices that is judged to be able to be connected.

Accordingly, in the case where at least one of the corresponding peripheral devices is to be connected to the plurality of peripheral device interfaces which are coupled to the body of the electronic apparatus through the signal line composed of an address line and a data line, therefore, the dummy loads corresponding to the peripheral devices are previously connected to the power source means, and the load information detecting means detects whether the peripheral devices can be connected to the corresponding peripheral device interfaces or not.

The controlling means controls the connecting means so that the power source means is connected to a peripheral device which is judged by the load information detecting means to be able to be connected, through the corresponding peripheral device interface. When the remaining capacity of the battery constituting the power source means is reduced and the load information detecting means determines at the time of checking by the dummy loads that a specific peripheral device cannot be connected, the controlling means controls the connecting means so that the power source means is not connected to the predetermined peripheral device. In this way, it is possible to previously conduct judgment on plural peripheral devices to check whether each of the peripheral devices can be connected under the remaining capacity of the power source means or not.

Further the invention is characterized in that the controlling means interrupts the voltage supplied from the power source means to the body of the electronic apparatus or a load of a peripheral device, on the basis of the load information from the load information detecting means, and then responds to the output of the voltage monitoring means which monitors a voltage under a state where the dummy load of the power source means is connected to the power source means, to cause the voltage supply to a load in which restoration of the voltage is ascertained, to be automatically restarted, after ascertaining the restoration.

Under a state where the dummy load means is connected to the power source means, the voltage monitoring means detects the output voltage of the power source means, the detected voltage is compared with the preset reference voltage, and the load information detecting means judges whether a load can be connected or not. If it is judged that the load cannot be connected, the controlling means conduct a control so that so that the voltage supplied from the power source means to the body of the electronic apparatus or a load is interrupted and the load is not connected to the power source means.

When the voltage of the power source means is recovered by replacing the battery constituting the power source means with a fresh one, charging the battery, or connecting the apparatus to an external power source via an adaptor, the voltage monitoring means detects the recovery. In the case where the load information detecting means determines that the power source means can be connected to the load, the controlling means conducts a control so that the power source means is connected to the load which can be connected, thereby automatically starting the voltage supply to the body of the electronic apparatus or the peripheral device which can be connected.

As described above, according to the invention, when a load is to be connected to an electronic apparatus using a battery, the remaining capacity of the battery is checked while connecting a dummy load to the apparatus, prior to the connection of the load. Therefore, the relatively simply configuration in which only the dummy load is disposed enables information of the battery indicating whether the battery can bear the connection of the load or not, to be obtained previously and correctly. Consequently, an accident in which a load is erroneously connected to a battery of an insufficient remaining capacity and data stored in the load are lost can be prevented from occurring. Since the remaining capacity of the battery is checked by using a plurality of dummy loads, it is possible to more correctly obtain information of the battery indicating whether the battery can bear the connection of the load or not.

When a peripheral device which will function as a heavy load is to be connected through a peripheral device interface, information relating to the remaining capacity of the battery is obtained by using a dummy load, prior to the connection of the peripheral device, and the connection of the peripheral device is restricted in accordance with the information. Therefore, only the basic system of the body may be operated so that the life time of the battery is prolonged, and, in accordance with the load level of the peripheral device, the connection of the device may be automatically performed. In this case, when a plurality of dummy loads are used, the connection of a peripheral device can be controlled more accurately, or plural peripheral devices can be selectively connected.

Moreover, the invention can provide an apparatus in which the operability is excellent, i.e., with respect to the function restricted because of an insufficient remaining capacity of a battery, the restriction is automatically canceled without conducting a special operation after the power source state is recovered, so that all functions are available.

An electronic apparatus of the invention is such constructed that a card-like electronic part on which an electronic circuit is mounted can be attached thereto. The electronic apparatus comprises a battery which is disposed as a power source; a functional circuit for receiving a power supply from the battery and conducting predetermined signal processing; remaining capacity detecting means for detecting a remaining capacity of the battery; and card driving means for receiving a power supply from the battery and driving a card-like electronic part attached to the apparatus. In the electronic apparatus, the card driving means is configured so that, when the card-like electronic part is to be driven, a driving capacity of the card driving means is gradually increased on the basis of a detection output from the remaining capacity detecting means and indicative of the remaining capacity of the battery.

In the invention, the card driving means for driving a card-like electronic part is configured so that, when the card-like electronic part is to be driven, the driving capacity of the card driving means is gradually increased on the basis of a detection output from the remaining capacity detecting means and indicative of the remaining capacity of the battery. Even when the remaining capacity of the battery is insufficient, or when a card-like electronic part requiring a driving capacity larger than the load capacity of the battery is to be driven, therefore, an inrush current which is produced when the card-like electronic part is connected to the battery can be suppressed. As a result, runaway of the apparatus and breakage of electronic pars such as LSI chips mounted on the apparatus which are due to the inrush current can be prevented from occurring.

As described above, according to the invention, when a card-like electronic part on which an electronic circuit is mounted is attached to the apparatus and a power is supplied to the card-like electronic part, the power supply capacity to the card is gradually increased while checking the remaining capacity of the incorporated battery. Therefore, the voltage fluctuation due to an inrush current when the card is connected can be suppressed, thereby attaining an effect that the apparatus is prevented from malfunctioning.

The invention is characterized in that the card driving means comprises a field effect transistor, and controls a gate voltage of the field effect transistor on the basis of the detection output of the remaining capacity of the battery from the remaining capacity detecting means, thereby adjusting a capacity of driving the card-like electronic part as a load of the battery.

In the invention, since the card driving means comprises a field effect transistor, and controls the gate voltage of the field effect transistor on the basis of the detection output of the remaining capacity of the battery from the remaining capacity detecting means, thereby adjusting a capacity of driving the card-like electronic part as a load of the battery, the card driving means can be realized by one semiconductor element, and hence it is possible to prevent the inrush current from adversely affecting the apparatus, without increasing the number of parts and complicating the circuit configuration.

According to the invention, the card driving means comprises a field effect transistor, and controls the gate voltage of the field effect transistor on the basis of the detection output of the remaining capacity from the remaining capacity detecting means, thereby adjusting a capacity of driving the card-like electronic part which functions as a load of the battery. In addition to the effects, the invention can attain a further effect that the number of parts constituting the card driving means can be reduced and the circuit design can be facilitated. As a result, an inrush current which is produced when a card-like electronic part is connected to the power source of the electronic apparatus can be suppressed while the production cost of the electronic apparatus is suppressed to a low level and the reliability of the circuit design is maintained to a high level.

The invention is characterized in that the apparatus further comprises power supply interrupting means for receiving the detection output of the remaining capacity of the battery from the remaining capacity detecting means, and for, when it is judged that the remaining capacity of the battery is equal to or lower than a predetermined value, interrupting the power supply from the battery to the card-like electronic part.

In the invention, the power supply interrupting means receives the detection output from the remaining capacity detecting means and indicative of the remaining capacity of the battery, and, when it is judged that the remaining capacity of the battery is equal to or lower than a predetermined value, interrupts the power supply from the battery to the card-like electronic part. Therefore, the power source level in the electronic apparatus is prevented from lowering to a level lower than the power source voltage VCC (5 V) which is necessary for the CPU, the ROM, etc. mounted on the electronic apparatus, and also the card-like electronic part to operate, with the result that the electronic apparatus is prevented from malfunctioning.

According to the invention, when it is judged that the remaining capacity of the battery is equal to or lower than a predetermined value, the power supply from the battery to the card-like electronic part is interrupted. Therefore, the invention can attain an effect that, even when the voltage of the battery is low, or when a card requiring a current exceeding the capacity of the battery is connected to the apparatus, it is possible to prevent a phenomenon that the power source voltage of LSIs constituting the CPU and other systems is lowered and the apparatus malfunctions, from occurring.

Further the invention is characterized in that the apparatus further comprises power source level detecting means for detecting a level of a power source supplied to an LSI chip on which the functional circuit is mounted; and power supply interrupting means for receiving a detection output from the power source level detecting means, and for, when it is judged that the level of the power source supplied to the LSI chip is equal to or lower than a predetermined value, interrupting the power supply from the battery to the card-like electronic part.

In the invention, the apparatus comprises the power source level detecting means for detecting the level of the power source supplied to an LSI chip on which the functional circuit is mounted, and, when it is judged that the level of the power source supplied to the LSI chip is equal to or lower than a predetermined value on the basis of the detection output of the power source level detecting means, the power supply from the battery to the card-like electronic part is interrupted. Therefore, it is possible to prevent a phenomenon that the power source voltage VCC (5 V) which is necessary for the CPU, the ROM, etc. mounted on the electronic apparatus, and also the card-like electronic part to operate cannot be secured and the electronic apparatus malfunctions, from occurring.

According to the invention, when it is judged that the level of the power source supplied to an LSI chip constituting the CPU and other systems is equal to or lower than the predetermined reference voltage, the power supply from the battery to the card-like electronic part is interrupted. Therefore, the invention can attain an effect that, even when the voltage of the battery is low, or when a card requiring a current exceeding the capacity of the battery is connected to the apparatus, it is possible to prevent a phenomenon that the power source voltage of the LSI constituting the CPU and other systems is lowered and the apparatus malfunctions, from occurring.

Further the invention is characterized in that the apparatus further comprises a circuit configuration which supplies a power from a power source outside the apparatus to portions inside the apparatus, in addition to a circuit configuration which supplies a power from the battery to the portions inside the apparatus, and also a switch circuit which is disposed between the power source outside the apparatus and the portions inside the apparatus, wherein, when the detection of the remaining capacity of the battery is to be conducted by the remaining capacity detecting means, the switch circuit interrupts the power supply from the power source outside the apparatus to the portions inside the apparatus.

In the invention, the apparatus further comprises a circuit configuration which supplies a power from a power source outside the apparatus to portions inside the apparatus, in addition to a circuit configuration which supplies a power from the battery to the portions inside the apparatus, and also a switch circuit which is connected between the power source outside the apparatus and the portions inside the apparatus, wherein, when the detection of the remaining capacity of the battery is to be conducted by the remaining capacity detecting means, the switch circuit interrupts the power supply from the power source outside the apparatus to the portions inside the apparatus. Even in the case where the power supply to the apparatus is conducted by the incorporated battery and also by the external power source, therefore, it is possible to correctly detect the current remaining capacity of the battery at this timing.

According to the invention, even in the case where the power supply to the apparatus is conducted by the incorporated battery and also by the external power source, when the remaining capacity of the battery is to be measured, the external power supply is interrupted by a switch. Therefore, the current remaining capacity of the battery at that timing can be correctly detected. According to this configuration, it is possible to previously know whether a case where the external power supply is stopped during when the card-like electronic part is operating can be sufficiently coped with by only the battery or not. Consequently, a maloperation of the apparatus which may be caused in such a special case by reduction of the power source voltage of an LSI constituting the CPU and other systems can be prevented from occurring.

BRIEF DESCRIPTION OF THE DRAWINGS

Other and further objects, features, and advantages of the invention will be more explicit from the following detailed description taken with reference to the drawings wherein:

FIG. 3A is a block diagram of a system main unit of the apparatus of FIG. 3;

DETAILED DESCRIPTION OF THE PREFERRED EMBODIMENTS

Figure 1:
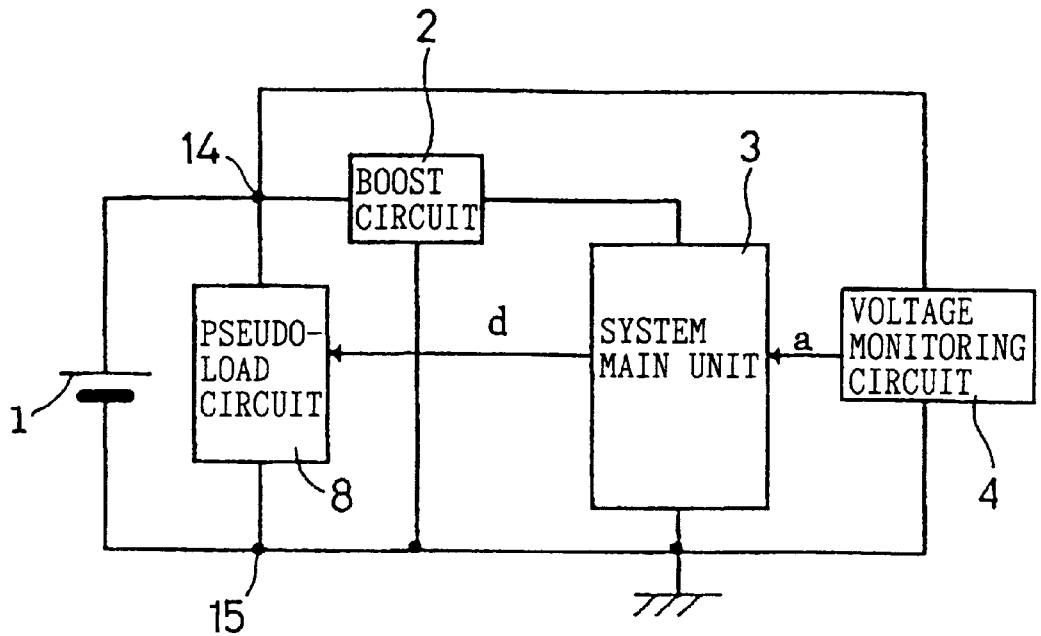
FIG. 1 is a block diagram showing a basic configuration of the invention.

Now referring to the drawings, preferred embodiments of the invention are described below.

Hereinafter, embodiments of the invention will be described. FIG. 1 is a block diagram showing a configuration of the invention. The voltage of a battery 1 is boosted by a boost circuit 2 and a power of a stable driving voltage is supplied to the system main unit 3 of an electronic apparatus. The voltage V of the battery 1 is always monitored by a voltage monitoring circuit 4. The voltage monitoring circuit 4 discriminates the level of the voltage V of the battery 1 by using voltages V0 and V10 which are discrimination levels described later, and outputs a detection signal a. For example, the voltage monitoring circuit 4 uses a dummy load 8-2, and detects a phenomenon that the voltage V of the battery 1 is caused by reduction of the remaining capacity of the battery 1 to be lowered to a level which is equal to or lower than the predetermined reference voltage V0 corresponding to the operating limit of the system main unit 3 of the electronic apparatus. When this phenomenon is detected, the circuit outputs the detection signal a (indicating that the capacity of the battery 1 is reduced) to the system main unit 3.

In response to a control signal d from the system main unit 3, a dummy-load circuit 8 (see FIG. 2) connects the dummy load 8-2 to the battery 1. The magnitude of the dummy load 8-2 of the dummy-load circuit 8 is selected so as to correspond to the magnitude of a load which is to be operated, for example, a peripheral device 18 (see FIG. 4 described later) such as a memory card or a printer which is to be connected to the apparatus, or a computer program application which is to be activated.

When the control signal d from the system main unit 3 is sent, the voltage monitoring circuit 4 monitors the terminal voltage of the battery 1 under a state where the dummy load of the dummy-load circuit 8 is connected to the battery 1. If the terminal voltage of the battery 1 under this state is higher than the predetermined reference voltage V0, it is judged that a load 10 or 18 or the like corresponding to the dummy load 8-2 (see FIG. 2 described later) can be connected.

When the load current from the battery 1 and flowing in the circuit is increased, the terminal voltage V of the battery 1 is lowered depending on the magnitude of the load. When the electronic apparatus 17 is activated, the load of the electronic apparatus 17 has the maximum value. The dummy load 8-2 which is equal to the maximum load is disposed. The voltage monitoring circuit 4 senses the terminal voltage V of the battery 1 which is lowered by a current flowing through the dummy load 8-2, and, before the power is supplied from the battery 1 to the load 10 or 18, detects whether the load 10 or 18 can be connected or not.

According to this configuration, unlike the prior art apparatus using a so-called passive detection system in which information of the state of a battery cannot be obtained unless the voltage of a battery is lowered by a connected load to a warning level or lower, the apparatus of the invention can anticipate the magnitude of the load 10 or 18 which the remaining capacity of the battery can bear, before the load is connected to the battery 1.

Figure 2:
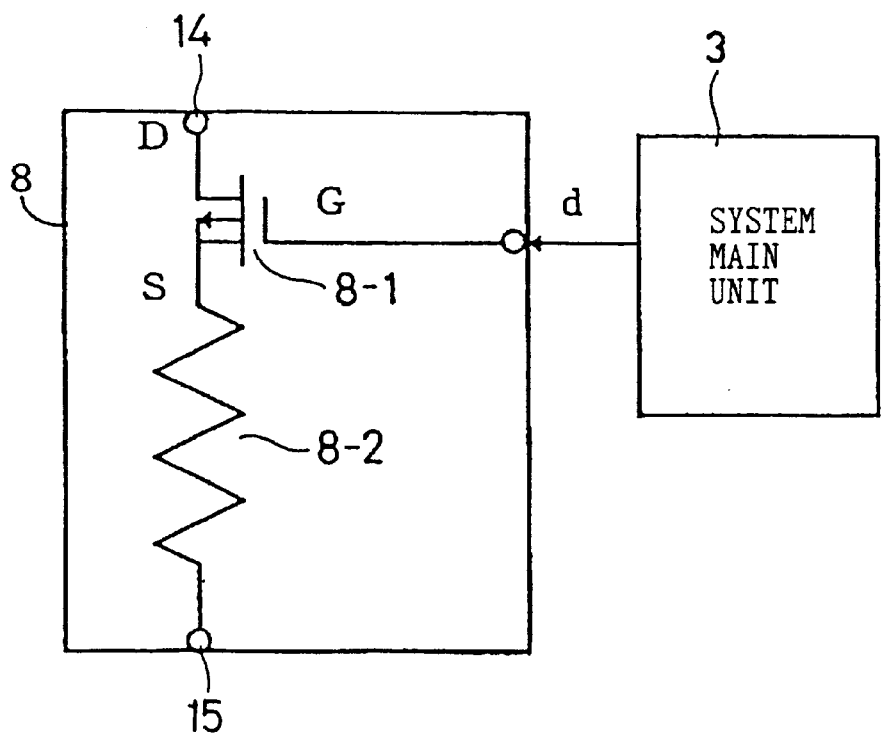
FIG. 2 is a diagram showing the configuration of a first example of a dummy-load circuit 8 used in the invention.

FIG. 2 is a block diagram of the embodiment and specifically showing the configuration of the dummy-load circuit 8. As described above, the load resistor 8-2 is selected so as to be equal to the maximum load of the system main unit 3 which is connected to the battery 1. A switching element 8-1 such as a field effect transistor (FET) is connected in series to the load resistor 8-2 which serves as the dummy load. When the control signal d is supplied from the system main unit 3 to the gate G of the switching element 8-1, conduction between the source S and the drain D of the switching element 8-1 is attained and the load resistor 8-2 serving as the dummy load is connected across the battery 1 of FIG. 1 through connecting points 14 and 15.

The value of the load resistor 8-2 is selected so as to correspond to the value of the maximum load which is to be connected to the battery 1, or, for example, selected so as to be equal to the maximum load. In all cases where any kind of load such as the peripheral device 18 or a computer program application is to be connected, therefore, it is possible to anticipate check whether the state of the battery 1 can bear such a load 10 or 18 or not.

Figure 3:
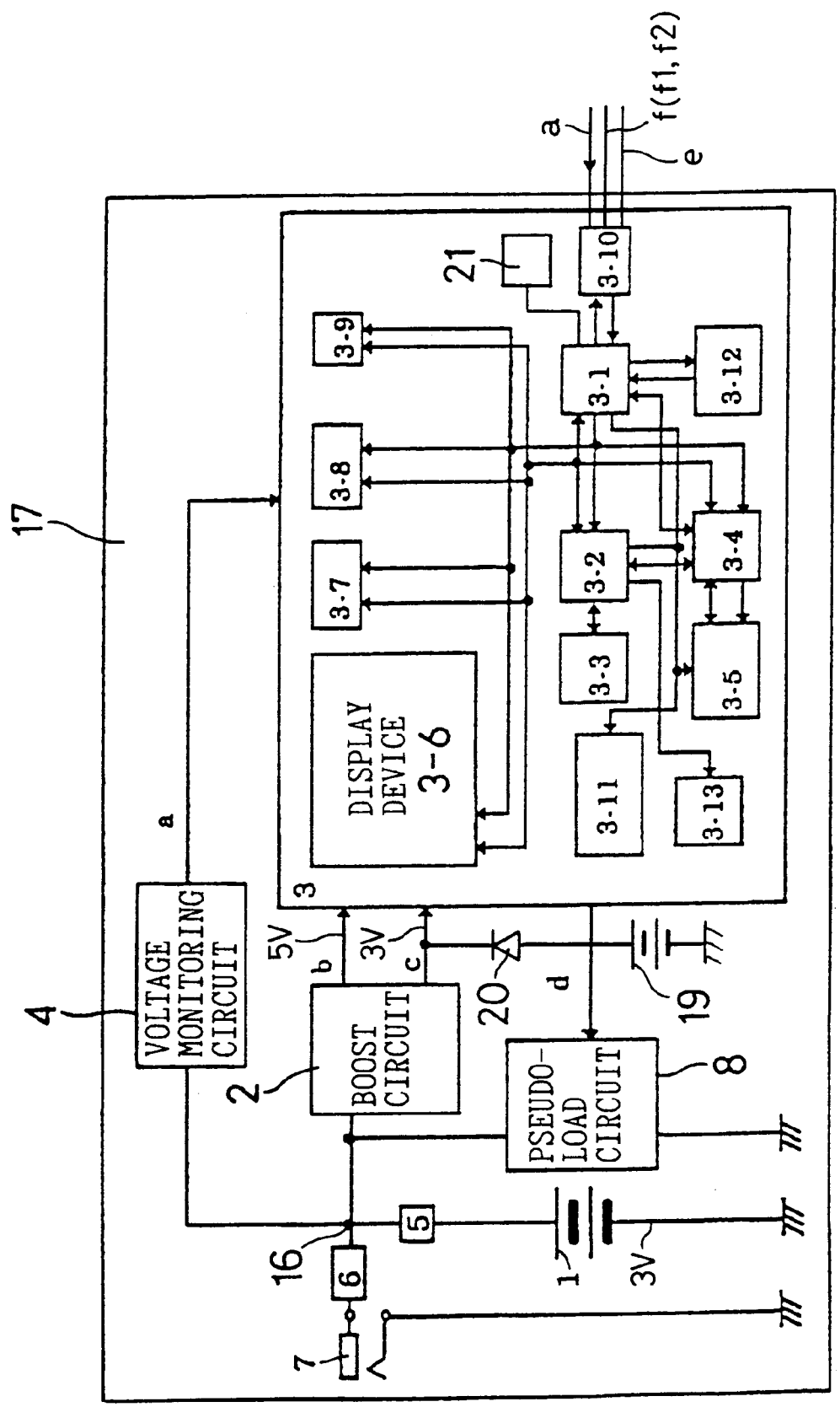
FIG. 3 is a block diagram of an electronic apparatus 17 of a first embodiment of the invention.

FIG. 3 is a block diagram of the electronic apparatus 17 which is an embodiment of the invention and into which the dummy-load circuit 8 shown in FIG. 2 is incorporated. The components corresponding to those of FIGS. 1 and 2 are designated by the same reference numerals and their description is omitted.

Referring to FIG. 3, the power is supplied to a connecting point 16 through an external power input terminal 7 and a protection circuit 6 which interrupts an excessive current. The secondary battery 1 is float-charged by the power through a circuit 5 which prevents overcharge from occurring. The power is supplied from the connecting point 16 to the boost circuit 2 which in turn supplies an output voltage of 3 V to the system main unit 3 through a line c and an output voltage of 5 V through a line b, thereby power-energizing the system main unit 3. In order to supply a power to a random access memory 3-8 and the like so as to retain the stored contents, the power from a backup battery 19 is supplied to the line c through a diode 20. In order to replace the battery 1 with a fresh one, the battery 1 may be temporarily removed (when the external power source is not connected to the connecting terminal 7), with the result that the voltage at the connecting point 16 becomes zero. Even in such a case, the voltage of 3 V is supplied to the line c from the backup battery 19 through the diode 20, and hence the contents of the random access memory 3-8 remain retained.

In the system main unit 3 (shown in detail in FIG. 3A), a control circuit (RTC) 3-3 is connected to a central processing circuit (CPU) 3-1 through a system gate array 3-2. Also a PCMCIA (Personal Computer Memory Card International Association) controller 3-4 is connected to the circuit 3-1. Card input/output means 3-5 to which a PCMCIA card is detachably attached and through which signals are transmitted is connected to the controller 3-4. A display device 3-6, a read-only memory (ROM) 3-7, the random access memory (RAM) 3-8, and a flash memory 3-9 are connected to the processing circuit 3-1.

Figure 4:
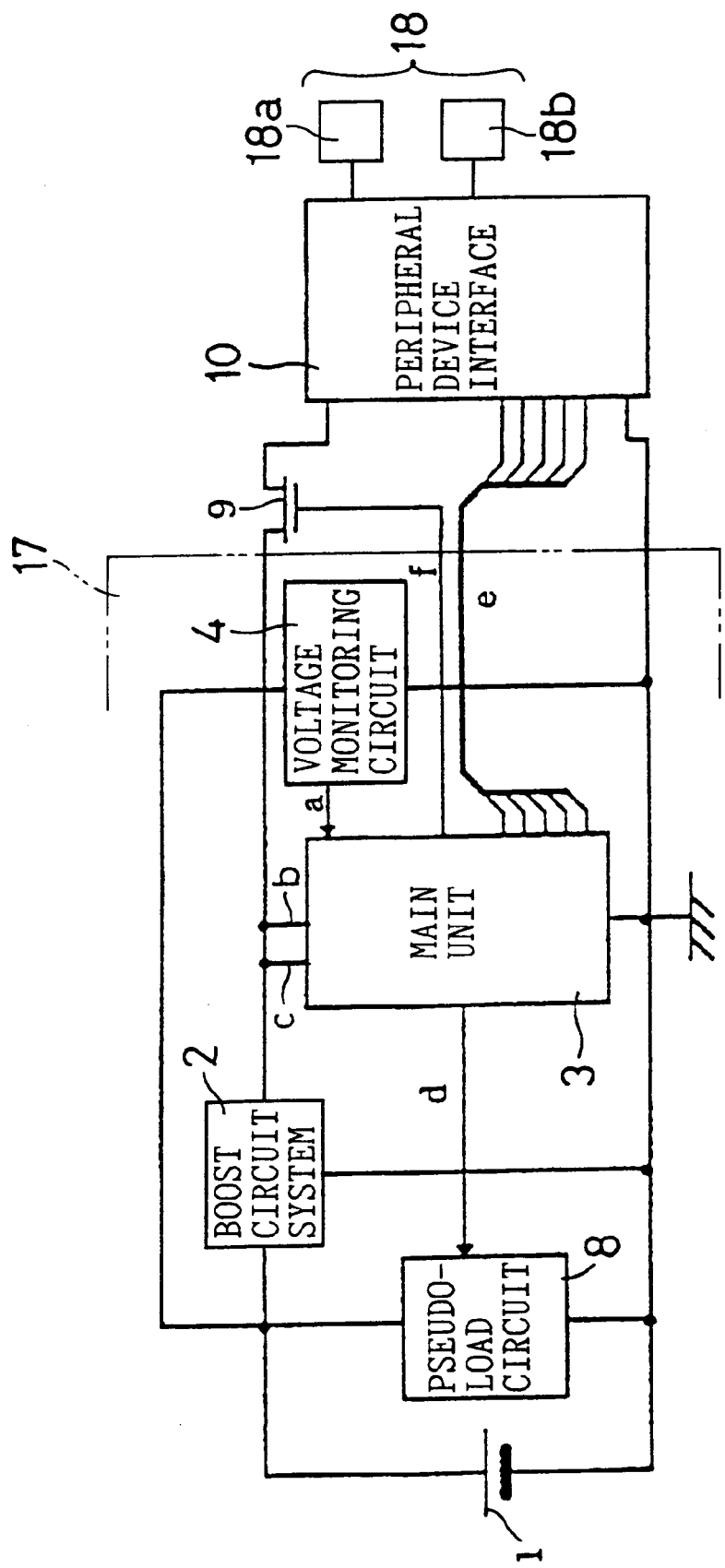
FIG. 4 is a block diagram of a system of an embodiment of the invention.

Furthermore, lines e and f are connected to the processing circuit 3-1 through a serial input/output interface (SIO) 3-10 so that the peripheral device interface 10 of FIG. 4 is connected to the circuit. One or plural peripheral devices are connected to the peripheral device interface 10. Signals are transmitted between the processing circuit 3-1 and the devices through the line e and the interface 3-10.

A tablet 3-11 which is a touch panel for a ten-key pad or the like, and input keys 3-12 are connected to the processing circuit 3-1 so that information can be input through them. An IR (Infrared) interface 3-13 is connected to the system gate array 3-2 so that infrared signals are transmitted between the apparatus and an external apparatus. For example, the electronic apparatus shown in FIG. 3 may be a portable electronic organizer.

FIG. 4 is a block diagram showing an embodiment which uses the dummy-load circuit 8 of FIG. 2. In FIG. 4, when a current flows from the battery 1 and the voltage V of the battery 1 is lowered to the voltage level V0 or less (which is the operating limit of the system main unit 3) the power supply to the peripheral device interface 10 and the peripheral device 18 is inhibited. The components corresponding to those of FIG. 2 are designated by the same reference numerals and their description is omitted. Referring to FIG. 4, the power is supplied from the battery 1 to the peripheral device interface (I/F) 10 to which the peripheral device(s) 18 is to be connected, through the boost circuit 2 and a switching element 9 which selectively interrupts the power supply to the peripheral device interface 10. A control signal which is generated by the system main unit 3 and which controls the power source of the peripheral device 18 is supplied to the gate terminal of the switching element 9 through the line f. The system main unit 3 supplies also signals such as address and data signals to the peripheral device interface 10 through the line e.

Before the power is supplied to the peripheral device 18, therefore, the system main unit 3 sends the control signal to the switching element 9 through the line f so that the state in which the switching element 9 is nonconductive is established. Under this state, the system main unit 3 sends out the control signal to the line d, whereby the switching element 8-1 is made conductive so that a current flows from the battery 1 to the dummy-load circuit 8. The voltage monitoring circuit 4 monitors the voltage of the battery 1 which appears as a result of the operation the dummy-load circuit 8.

When the voltage drop of the battery 1 is small and the output voltage V of the battery 1 is high, the voltage of the battery 1 is higher than the voltage level V0 of the operating limit of the system main unit 3. In such a case, the voltage monitoring circuit 4 sends out a control signal to the line a. In response to this, the processing circuit 3-1 of the system main unit 3 delivers the control signal to the line f. The reference characters a to f are used for identifying the lines and currents flowing through the lines. The switching element 9 is caused to be conductive by the control signal f. Consequently, a predetermined voltage is supplied from the boost circuit 2 to the peripheral device interface 10 and the peripheral device 18. The system main unit 3 supplies the signal e to the peripheral device 18 through the peripheral device interface 10.

After the voltage monitoring circuit 4 supplies to the system main unit 3 a signal indicative of the monitor result of the voltage of the battery 1 through the line a, the processing circuit 3-1 of the system main unit 3 sends out the control signal to the line d. When the dummy-load circuit 8 has the configuration of FIG. 2, this causes the switching element 8-1 to remain nonconductive.

When, as a result of the power consumption of the peripheral device interface 10, the peripheral device 18, and the like, the voltage of the battery 1 which is monitored by the voltage monitoring circuit 4 is then lowered to a level equal to or lower than the voltage level V0 of the operating limit of the system main unit 3, the voltage monitoring circuit 4 supplies the signal indicative of this to the system main unit 3 through the line a. In response to this signal, the system main unit 3 inverts the polarity of the control signal f so as to make the switching element 9 nonconductive. Therefore, the power supply to the peripheral device interface 10 is interrupted, with the result that the power supply to the peripheral device interface 10 and the peripheral device 18 coupled to the interface is cut off.

Figure 7:
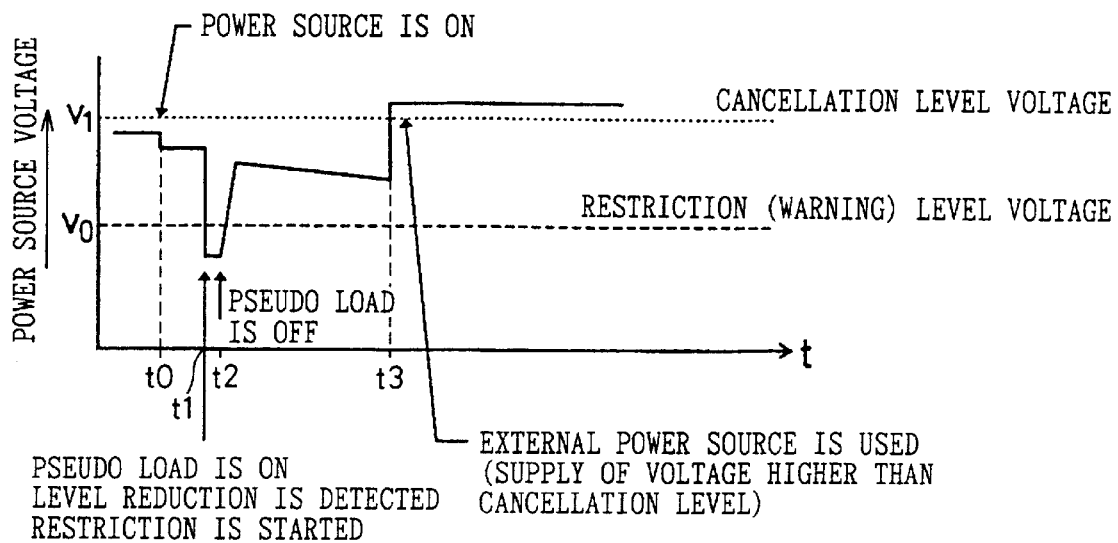
FIG. 7 is a view illustrating the operation of the invention in the system shown in FIGS. 1 to 4.

The system main unit 3 remains to be always powered by the battery 1 through the boost circuit 2 and also by the backup battery 19. Consequently, the stored contents of the random access memory 3-8 and the flash memory 3-9 shown in FIG. 7 are always retained.

Figure 5:
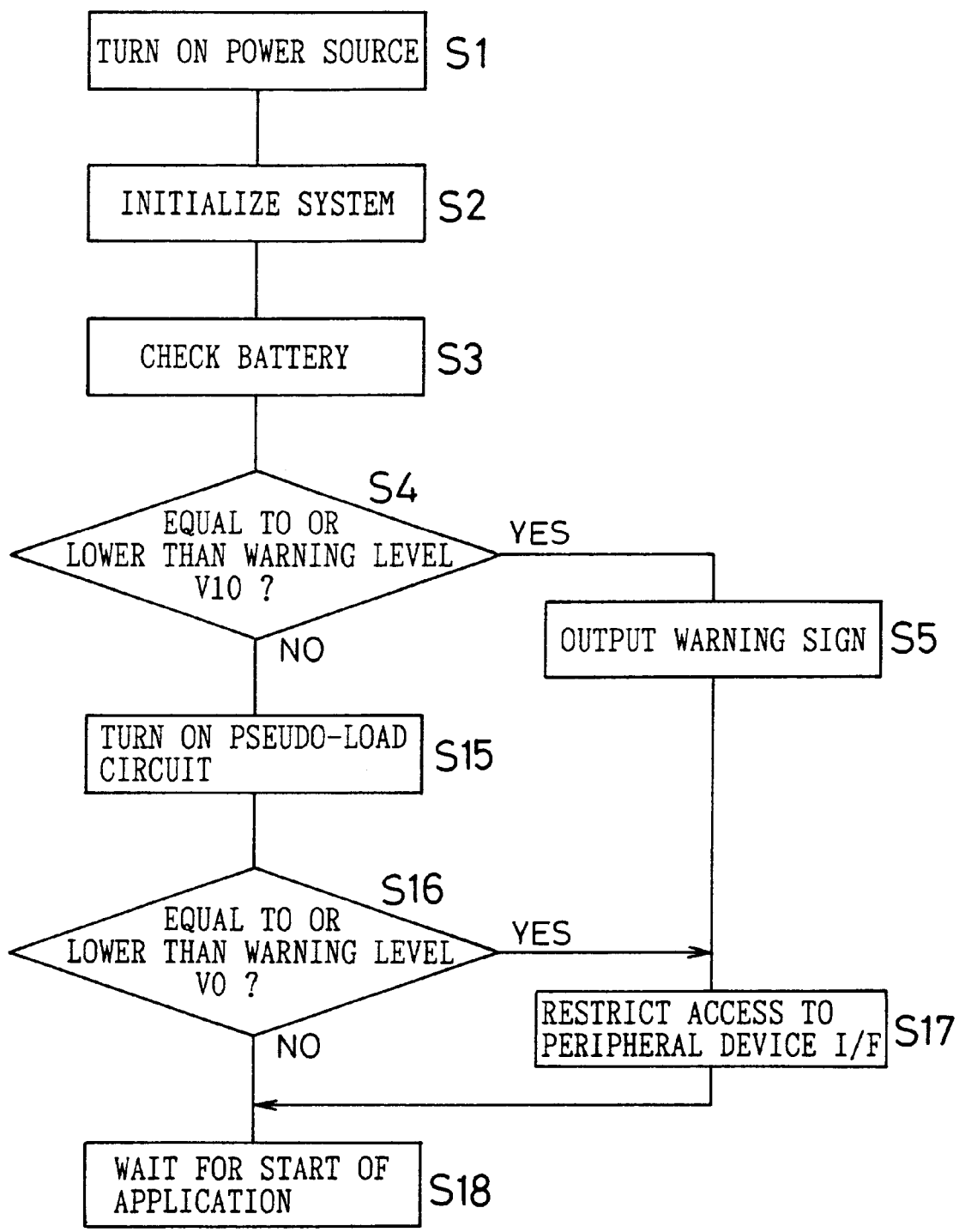
FIG. 5 is a flowchart illustrating the operation at activation of the invention in the system shown in FIGS. 1 to 4.

The operation at activation of the system of the embodiment shown in FIGS. 1 to 4 will be described with reference to a process flow shown in FIG. 5. Referring to FIG. 5, a power source on/off switch 21 of the electronic apparatus 17 is operated at step S1 so that the power supply is turned on, and the voltage V of the battery 1 is then checked at step S2. Namely, steps S1 to S5 constitutes a process flow of checking the battery 1 at activation of the electronic apparatus 17. When the power source is turned on at step S1, the system main unit 3 is initialized at step S2, and sends out the control signal to the line f so that the switching element 9 is kept nonconductive. The voltage monitoring circuit 4 detects at step S3 the voltage V of the battery 1, and compares at step S4 the detected voltage V with the preset reference voltage V10.

If the detected voltage V is higher than the reference voltage V10, the process proceeds to step S15. If the detected voltage V is equal to or lower than the reference voltage V10, the process proceeds to step S5. At step S5, the display device 3-6 conducts a display output process of generating a battery replacement warning sign which warns the user that the battery 1 is to be replaced with a fresh one.

If the voltage V of the battery 1 is equal to or lower than V10 at step S4, the battery replacement warning sign is displayed at step S0 as described above, and a process of restricting access to the peripheral devices 10 and 18 is conducted at step S17 (the checking process using the dummy-load circuit 8 is not conducted). That is, the switching element 9 remains nonconductive.

The processes of step S1 to S4 are conducted by the voltage monitoring circuit 4. The voltage monitoring circuit 4 outputs the detection signal a indicating that the voltage V of the battery 1 is equal to or lower than the voltage V10 just above the voltage V0 (V0<V10) which is the operating limit at activation of the system main unit 3 of the electronic apparatus 17 or not. If the detection signal a indicates that the output voltage V of the battery 1 is equal to or lower than the voltage V10, the system main unit 3 produces an interruption in the program which is currently executed by the processing circuit 3-1, and performs the process of outputting a warning sign for replacement of the battery 1, such as a display of a battery replacement warning mark, a display of a message requesting replacement of the battery, or emission of an alarm sound.

If the voltage V of the battery 1 detected by the voltage monitoring circuit 4 is higher at step S4 than the predetermined reference voltage V10, the switching element 8-1 of the dummy-load circuit 8 is turned on at step S15 for a short period by the control signal d from the system main unit 3, thereby connecting the dummy load 8-2 to the battery 1. The voltage monitoring circuit 4 detects the voltage V of the battery 1 appearing as a result of the operation of the dummy-load circuit 8.

Then, it is checked at step S16 whether the detected voltage V is equal to or lower than the preset reference voltage V0 or not. If the detected voltage V is equal to or lower than the reference voltage V0, the process proceeds to step S17 and the switching element 9 is kept to be turned off by the control signal f. As a result, access to the peripheral device interface 10 and the peripheral device 18 is restricted.

If it is judged at step S16 that the detected voltage is equal to or higher than the reference voltage V0, or if the process of restricting access to the peripheral device interface 10 at step S17 is canceled, the process proceeds to step S18 and the switching element 9 is made conductive by the control signal f. As a result, the peripheral device interface 10 and the peripheral device 18 are initialized, and the process enters the stand-by state in which the system waits for activation of the computer program application for the peripheral device 18. After activation, the apparatus is operated.

If it is judged on the basis of information obtained by using the dummy-load circuit 8 that the remaining capacity of the battery 1 cannot afford to drive the peripheral device 18, the program process is conducted so that the use of the peripheral device 18 is restricted and the operation of the system main unit 3 is ensured. In the prior art apparatus, even when the terminal voltage V of the battery 1 under the state where a load is connected becomes equal to or lower than the preset warning level V10, the peripheral device is accessed and an operation of a large load is conducted, with the result that the system main unit falls into a disfunctional state. According to the invention, it is possible to prevent such an accident from occurring.

In the embodiment described above, if the output voltage V of the battery 1 which is detected by the voltage monitoring circuit 4 when the switching element 8-1 of the dummy-load circuit 8 is turned on is equal to or lower than the reference voltage V0, the switching element 9 is turned off.

Another embodiment of the invention may be configured in the following manner. The system main unit 3 causes by means of the control signal f the switching element 9 to be turned on, and supplies the signal e to the peripheral device interface 10, whereby the peripheral device interface is controlled so that the power is supplied only to a peripheral device 18a of small power consumption, among plural peripheral devices 18, and not supplied to a peripheral device 18b of large power consumption.

A further embodiment of the invention may be configured in the following manner. If the detection voltage V is equal to or lower than the reference voltage V0, the system main unit 3 causes the switching element 9 to be turned on, and supplies the signal e to the peripheral device interface 10. In response to the signal e, the peripheral device interface 10 controls the peripheral device 18 so that a program calculation process of large power consumption is not performed and only a program calculation process of small power consumption is performed.

Next, the operation in the case where the power source state is improved will be described with reference to FIGS. 7, 7, and 8. At time t0 of FIG. 7, the power source is turned on by operating the power source switch 21 of the electronic apparatus 17. The control signal d is supplied from the system main unit 3 to the dummy-load circuit 8 of FIG. 4 so that the switching element 8-1 becomes conductive. When the voltage V of the battery 1 is lowered and becomes at time t1 equal to or lower than the restriction level or the voltage V0 shown in FIG. 7, the control signal f is supplied from the system main unit 3 so that the switching element 9 is always turned off. Therefore, the switching element 9 is turned off, and the power supply to the peripheral device interface 10 and the peripheral device 18 is interrupted. At time t2, the switching element 8-1 is made nonconductive by the control signal d from the system main unit 3.

Figure 8:
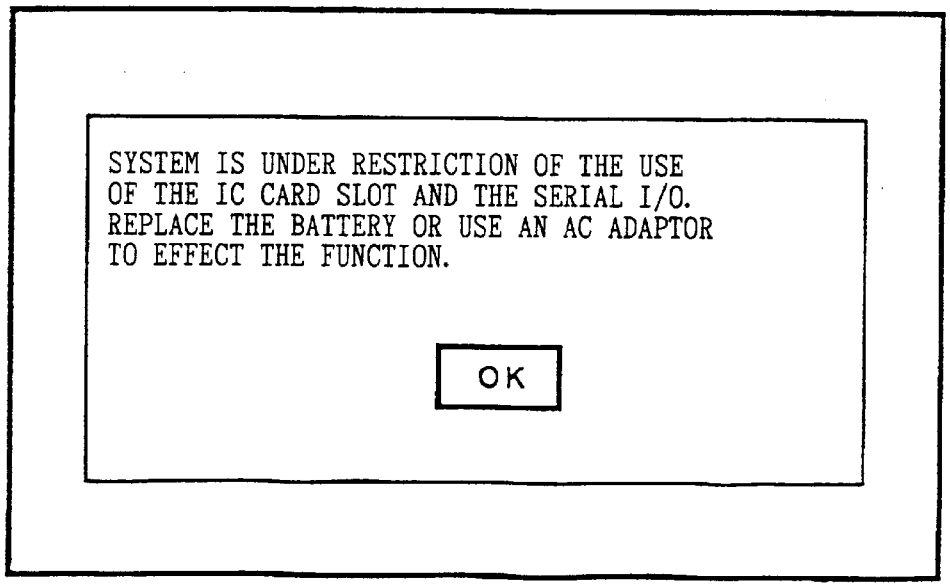
FIG. 8 is a front view showing a display example in a display device 3-6 during the operation of the invention.

Under this state, the display device 3-6 displays a message such as shown in FIG. 8 so as to warn the operator who wishes to use the peripheral device 18. The operator reads the displayed contents shown in FIG. 8, and, at time t3 of FIG. 7, connects an external power source such as an AC adaptor to the external power input terminal 7. In place of connecting an external power source, the operator may remove away the battery 1 and attach a fresh battery to the apparatus.

Figure 6:
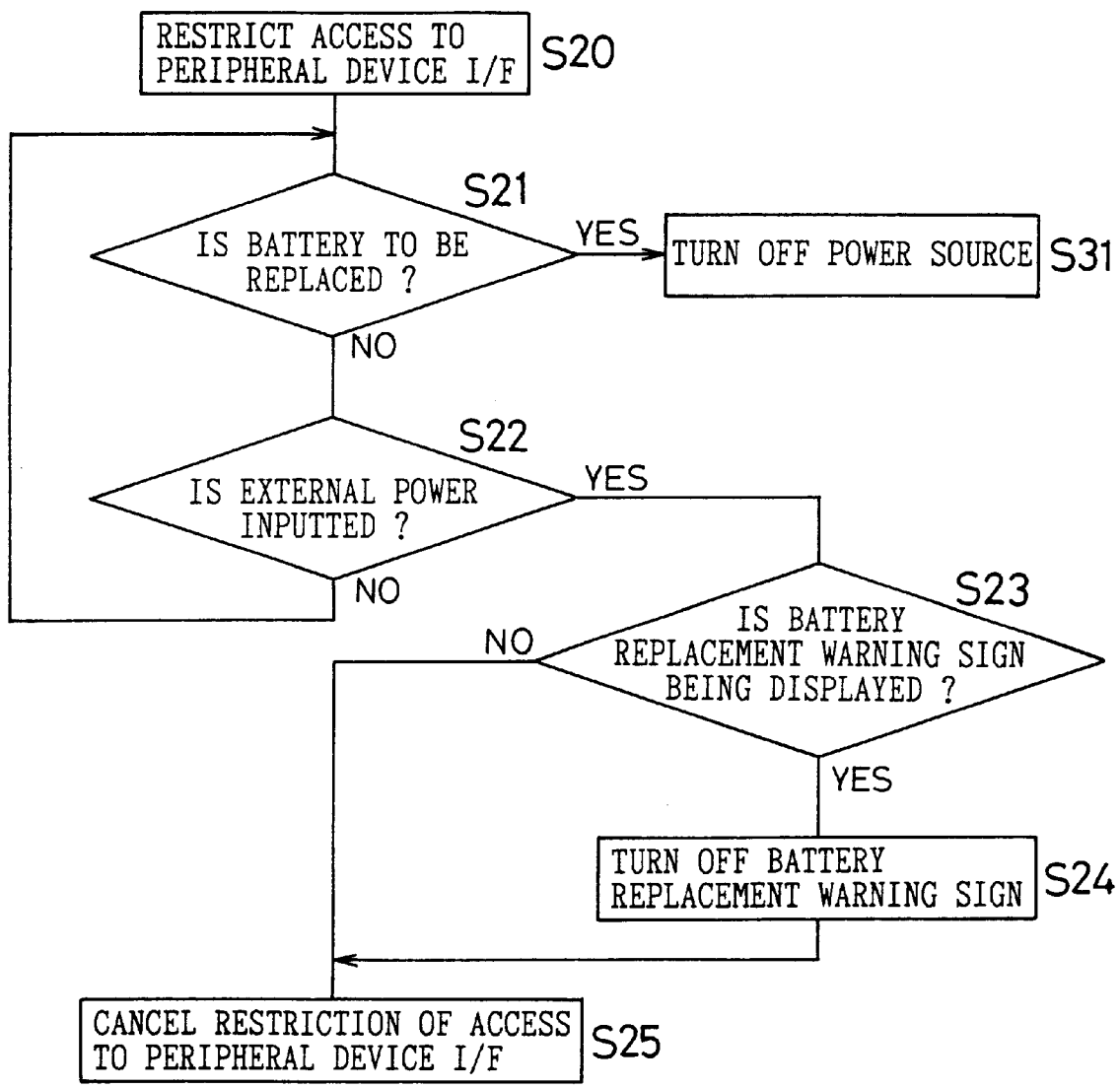
FIG. 6 is a flowchart illustrating the operation of the invention when the power source state is recovered in the system shown in FIGS. 1 to 4.

Step S20 of FIG. 6 is an operation which is to be conducted after time t2 of FIG. 7 and which is identical with the state of step S17 of FIG. 5. When access to the peripheral devices 10 and 18 is restricted in this way, the power source voltage V can be recovered by connecting an external power source such as an AC adaptor, or by replacing the battery 1 with a fresh one so as to supply the power. During the period between times t2 and t3, or a period which starts from time t2 and continues until the battery is replaced with a fresh one, the processing circuit 3-1 controls the switching element 9 so as to be kept to be nonconductive, whereby access to the peripheral devices 10 and 18 is continued to be restricted.

The process proceeds from step S20 in which access to the peripheral device 18 is restricted, to step S21. If replacement of the battery 1 is to be done, the operator operates the power source switch 21 so that the power source is turned off. This causes the processing circuit 3-1 to perform the operation of terminating the calculation process so as to attain the standby state which, when the power source switch 21 is again operated and the power source is turned on, enables the calculation process to be initialized and the calculation operation to be next conducted. When the power source switch 21 is again operated so as to be turned on after replacement of the battery 1, the system main unit 3 normally operates.

If the battery 1 is not replaced and an external power source such as an AC adaptor is connected at step S22 to the connecting terminal 7, the voltage at the connecting point 16 is equal to or higher than a cancellation level voltage V1 shown in FIG. 7. When the use of the external power source makes the voltage at the connecting point 16 to be returned to be equal to or higher than the cancellation level voltage V1 shown in FIG. 7, the switching element 9 is turned on by the control signal f. When the peripheral device 18 is to be used, therefore, the switching element 9 is turned on at this time t3 so that the peripheral device interface 10 is initialized. The voltage monitoring circuit 4 detects the voltage V at the connecting point 16. If it is judged that the voltage is equal to or higher than the cancellation level voltage V1, the process proceeds to step S23. The processing circuit 3-1 of the system main unit 3 judges whether the battery replacement warning sign is currently displayed by the display device 3-6 or not.

If the battery replacement warning sign is displayed by the display device 3-6 of the system main unit 3, the display of the battery replacement warning sign is turned off at step S24.

At step S25, the control signal f is inverted and the switching element 9 is made conductive. As a result, the peripheral device interface 10 is powered so that also the peripheral device 18 is powered. In this way, when access to the peripheral device 18 is once restricted, the program processing is performed so as to continue restriction of the operation of the system main unit 3 until the state of the power source voltage is thoroughly improved or, in other words, the battery 1 is replaced or an external power source is connected.

In the prior art apparatus, a load such as the peripheral device 18 is connected before complete recovery of the power source voltage is attained, with the result that the system main unit falls into a disfunctional state. This causes an accident such as that data which are currently produced disappear. According to the invention, it is possible to prevent such an accident from occurring.

As described above, the voltage monitoring circuit 4 discriminates the level of the voltage at the connecting point 16 by using the cancellation level voltage V1. If the voltage at the connecting point 16 is equal to or higher than the cancellation level voltage V1, it is judged that an external power source is connected to the connecting terminal 7, and the signal indicative of this is sent out to the line a to be supplied to the processing circuit 3-1 of the system main unit 3. When an external power source is connected to the connecting terminal 7 in this way, the display of the battery replacement warning sign on the display device 3-6 is turned off.

When an external power source is not connected to the connecting terminal 7, the voltage V at the connecting point 16 is lower than the cancellation level voltage V1 (i.e., V<V1) even in the case where a battery of a large remaining capacity such as a fresh battery is used as the battery 1. If the voltage at the connecting point 16 is higher than the restriction level voltage V0 and lower than the cancellation level voltage V1, the voltage monitoring circuit 4 sends the signal indicative of this to the processing circuit 3-1 of the system main unit 3 through the line a. Therefore, the processing circuit 3-1 turns off the battery replacement warning sign on the display device 3-6 as described above.

Figure 9:
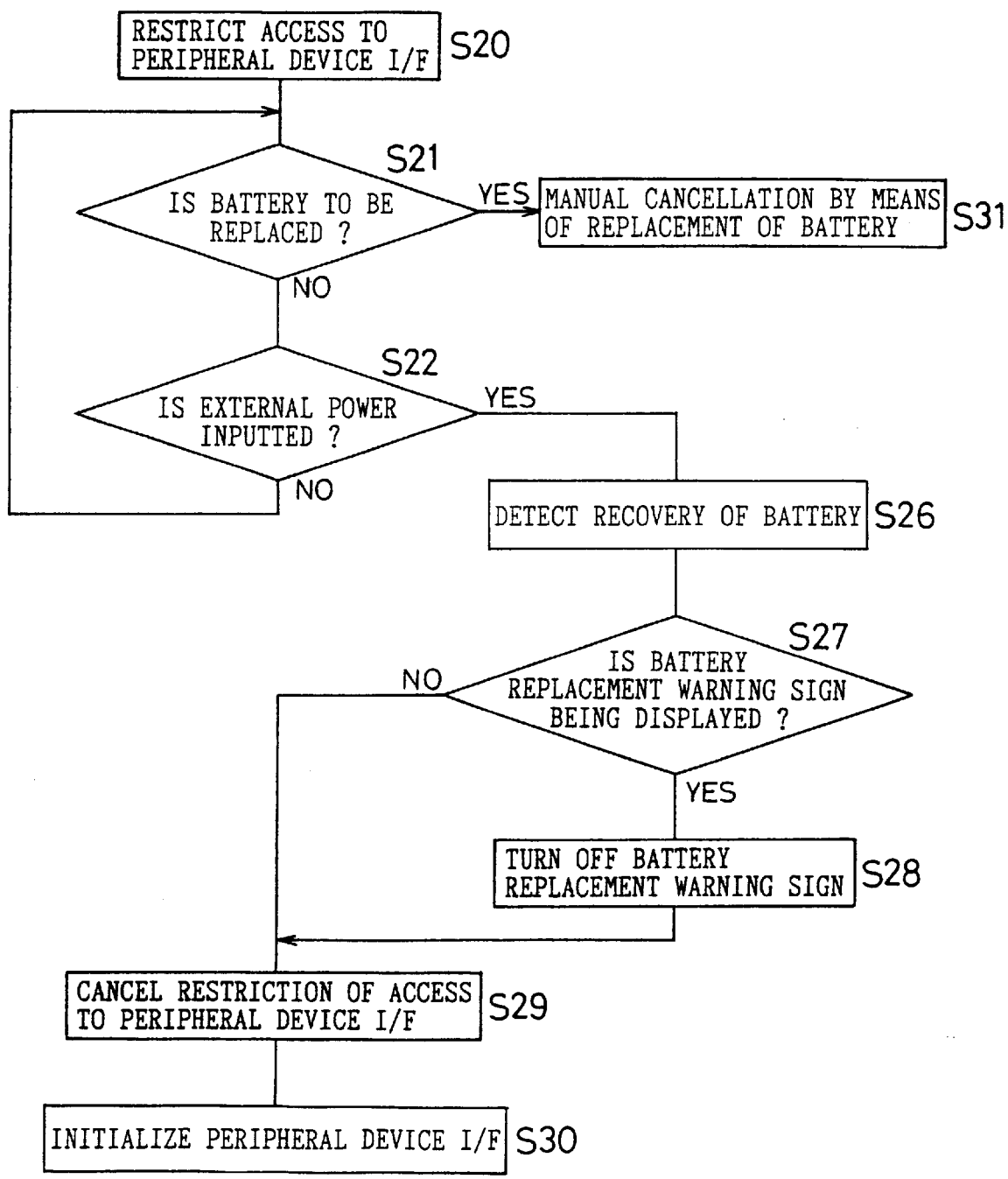
FIG. 9 is a flowchart illustrating the operation when the power source state is recovered in another embodiment of the invention in the system shown in FIGS. 1 to 4.

FIG. 9 is a flowchart illustrating the operation of the embodiment of the invention shown in FIGS. 1 to 8. The operation shown in FIG. 9 is similar to that of FIG. 6 described above, and corresponding portions are designated by the same reference numerals. When an external power source is connected at step S22 of FIG. 9, the voltage at the connecting point 16 is raised to a level higher than the cancellation level voltage V1 as described above. If recovery of the voltage V is detected at step S26, the process proceeds to step S27. Steps S27 and S28 are the same as steps S23 and S24 of FIG. 6 described above, and step S29 is the same as step S25 of FIG. 6. In the invention, the peripheral device interface 10 and the peripheral device 18 are initialized at step S30 and the apparatus enters the state of waiting for activation. When the activation instruction is given, the operating state is restarted.

This will be described more specifically. If an input of an external power source is detected at step S22 as a result of connection of the external power source, it is detected at step S26 whether the voltage is recovered to the cancellation level voltage V1 of FIG. 7 or not. If it is detected that the voltage is recovered to the cancellation level voltage V1, it is judged at step S27 whether the battery replacement warning sign is currently displayed or not. If the warning sign is displayed, the display of the sign is turned off at step S28, and the process proceeds to step S29. The switching element 9 is turned on by the control signal f from the system main unit 3 so that the power is supplied to the peripheral device interface 10.

Then, restriction of access to the peripheral device interface 10 is canceled, and the peripheral device interface 10 is initialized at step S30. In the case where the battery voltage of the electronic apparatus is lowered and access to a peripheral device is restricted, when the battery is replaced with a fresh one, it is not required to automatically cancel restriction of access to the peripheral device, because the power source of the apparatus is once turned off and the apparatus is rebooted after completion of the battery replacement. By contrast, when an external power source such as an AC adaptor is to be used, restriction of access to the peripheral device is automatically canceled without performing a special operation such as initialization or reboot of the apparatus, at the timing when recovery of the voltage of the power source is detected.

Figure 10:
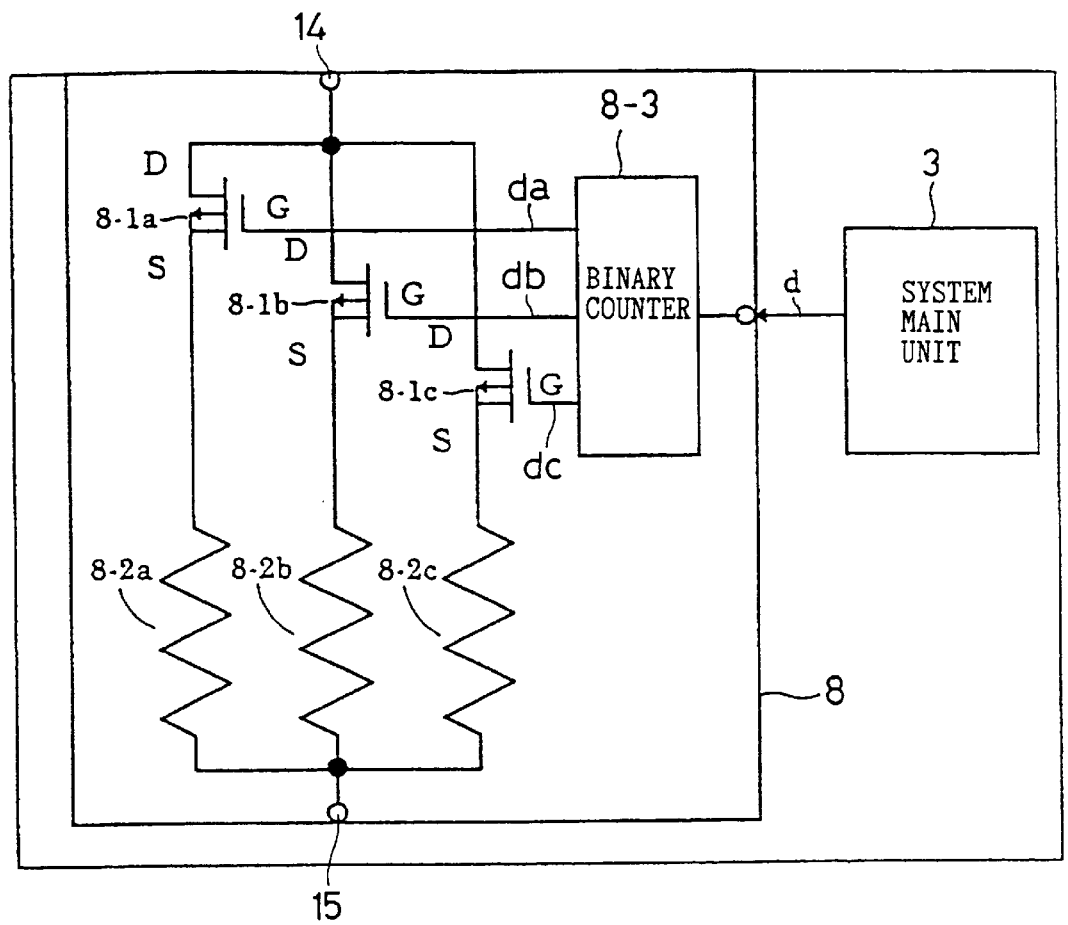
FIG. 10 is a diagram showing the configuration of a second example of the dummy-load circuit 8 used in the invention.

FIG. 10 is a block diagram showing another embodiment in which the value of the dummy load resistor of the dummy-load circuit 8 can be changed. Series circuits of switching elements 8-1a, 8-1b, and 8-1c each composed of a field effect transistor (FET) or the like, and load resistors 8-2a, 8-2b, and 8-2c serving as a dummy load are connected in parallel so as to configure a parallel circuit. The parallel circuit is connected to the battery 1 of FIG. 1 at the connecting points 14 and 15.

Figure 11:
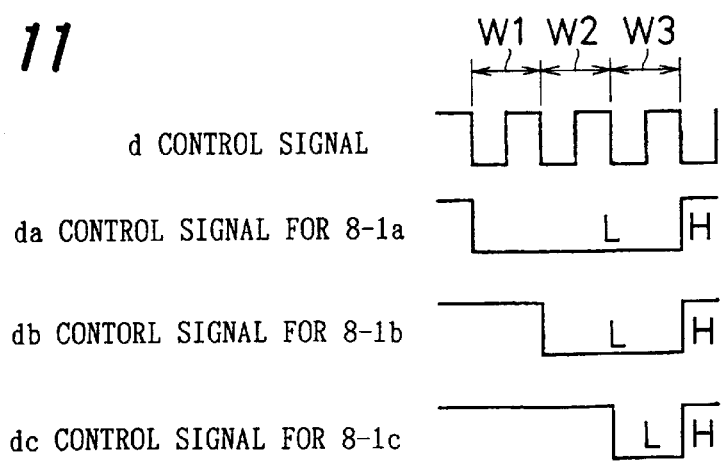
FIG. 11 is a waveform chart illustrating the operation in the case where the dummy-load circuit shown in FIG. 10 is used.

Control signals da, db, and dc of a binary counter 8-3 are supplied to the gates G of the switching elements 8-1a, 8-1b, and 8-1c, respectively. The binary counter 8-3 counts a control signal d from the system main unit 3 which consists of clock pulses shown in FIG. 11. As shown in FIG. 11, the control signal da for the switching element 8-1a, the control signal db for the switching element 8-1b, and the control signal dc for the switching element 8-1c are produced in mode periods W1 to W3, respectively.

Therefore, the switching elements 8-1a, 8-1b, and 8-1c are sequentially turned on without forming intervals as shown in FIG. 11. The load resistors 8-2a, 8-2b, and 8-2c are set so as to have the same resistance R. When the switching elements 8-1a, 8-1b, and 8-1c are sequentially turned on in the periods W1 to W3, the resistance of the dummy load appearing across the connecting points 14 and 15 is stepwise switched so as to be one of three stages, R, R/2, and R/3.

When the synthesized value of the dummy load across the connecting points 14 and 15 is changed as described above, the voltage monitoring circuit 4 reads; the terminal voltage V of the battery 1 which corresponds to each synthesized value of the dummy load across the connecting points 14 and 15. The maximum load which can be driven by the currently used battery 1 can be previously detected from the voltage V. Information obtained by using the plurality of dummy loads 8-2a, 8-2b, and 8-2c can be used as information for selecting a plurality of loads which are to be connected. By using information obtained from the dummy loads, a calculation circuit of the system main unit 3 may obtain more accurate information on a specific load which is to be connected.

In the embodiment, the three load resistors 8-2a, 8-2b, and 8-2c serving as a dummy load are set so as to have the same resistance. In another embodiment, the resistors may have different resistances.

Figure 12:
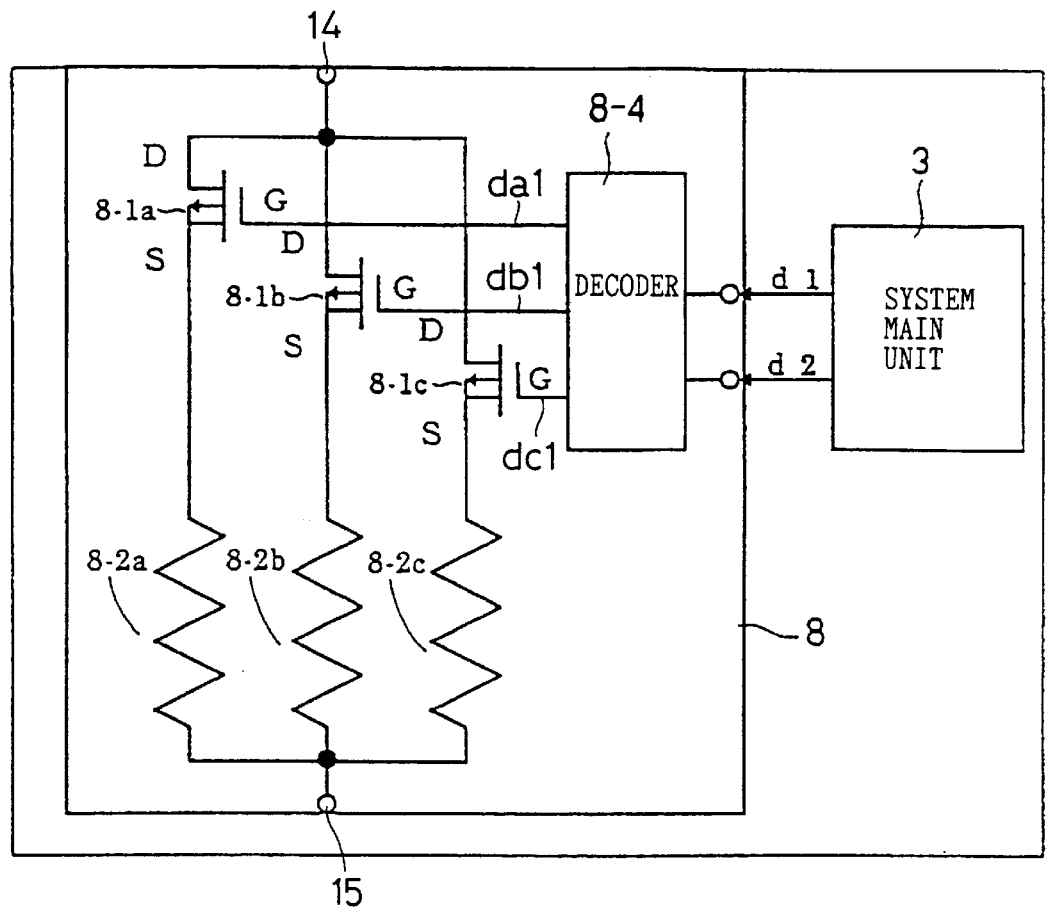
FIG. 12 is a diagram showing the configuration of a third example of the dummy-load circuit 8 used in the invention.

FIG. 12 is a block diagram showing another embodiment in which the values of the dummy load resistor 8-2a, 8-2b, and 8-2c of the dummy-load circuit 8 can be changed. The present embodiment is different from the embodiment shown in FIGS. 10 and 11 in that the switching elements 8-1a, 8-1b, and 8-1c such as FETs are selectively turned on one by one in sequence so that respective conductive periods W1, W2, and W3 are shifted from each other as shown in FIG. 13.

Figure 13:
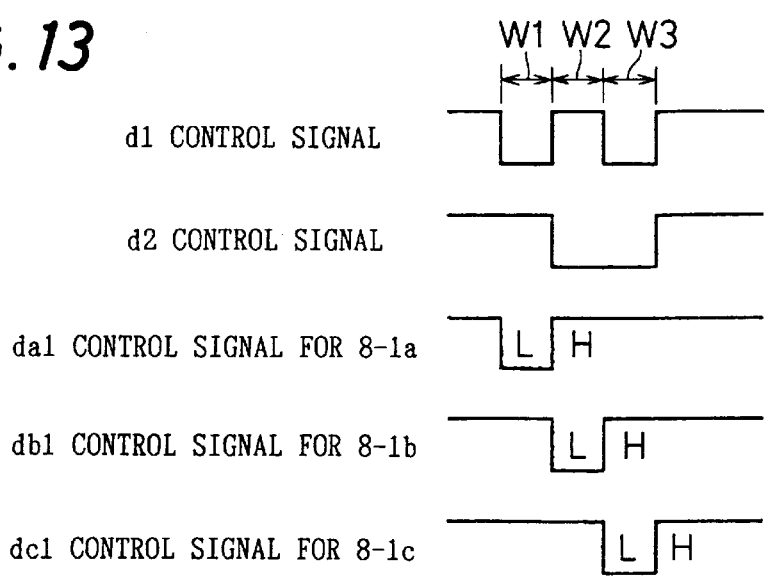
FIG. 13 is a waveform chart illustrating the operation in the case where the dummy-load circuit shown in FIG. 5 is used.

The system main unit 3 produces two control signals d1 and d2 shown in FIG. 13 and the control signals are supplied to a decoder 8-4. In response to the control signals d1 and d2, the decoder 8-4 produces a control signal da1 for the switching element 8-1a of FIG. 12, a control signal db1 for the switching element 8-1b, and a control signal dc1 for the switching element 8-1c. The control signals da1, db1, and dc1 are supplied to the gates G of the respective switching elements 8-1a, 8-1b, and 8-1c.

Therefore, the synthesized value of the dummy load across the connecting points 14 and 15 has a value which is obtained by sequentially selectively switching the load resistors 8-2a, 8-2b, and 8-2c. For example, the resistance R82a of the load resistor 8-2a, the resistance R82b of the load resistor 8-2b, and the resistance R82c of the load resistor 8-2c may be set so as to have the following relationships:

$$R82a > R82b > R82c.$$

In another embodiment, the values of the load resistors 8-2a, 8-2b, and 8-2c may be suitably set so as to be different from each other. When the load resistors 8-2a, 8-2b, and 8-2c are switched, the maximum load which can be driven by the currently used battery 1 can be detected in a similar manner as the embodiment shown in FIG. 10.

In the embodiments shown in FIGS. 10 and 12, the resistance of the dummy load is switched in three stages, and the voltage monitoring circuit 4 monitors the terminal voltage of the battery for each stage, thereby detecting the maximum load which can be driven by the used battery. In another embodiment, the manner of switching the load resistors 8-2a, 8-2b, and 8-2c is not restricted to the three-stage switching. In the case where loads which are to be connected to the battery 1 are previously determined, a plurality of dummy loads having values which are respectively equal to the magnitudes of the plurality of loads to be connected may be disposed.

In the embodiments shown in FIGS. 2, 10, and 12, FETs are used as the switching elements 8-1, 8-1a, 8-1b, and 8-1c. Alternatively, switching elements other than FETs may be used as far as a current of the order of several milliamperes can flow through the switching elements.

Figure 14:
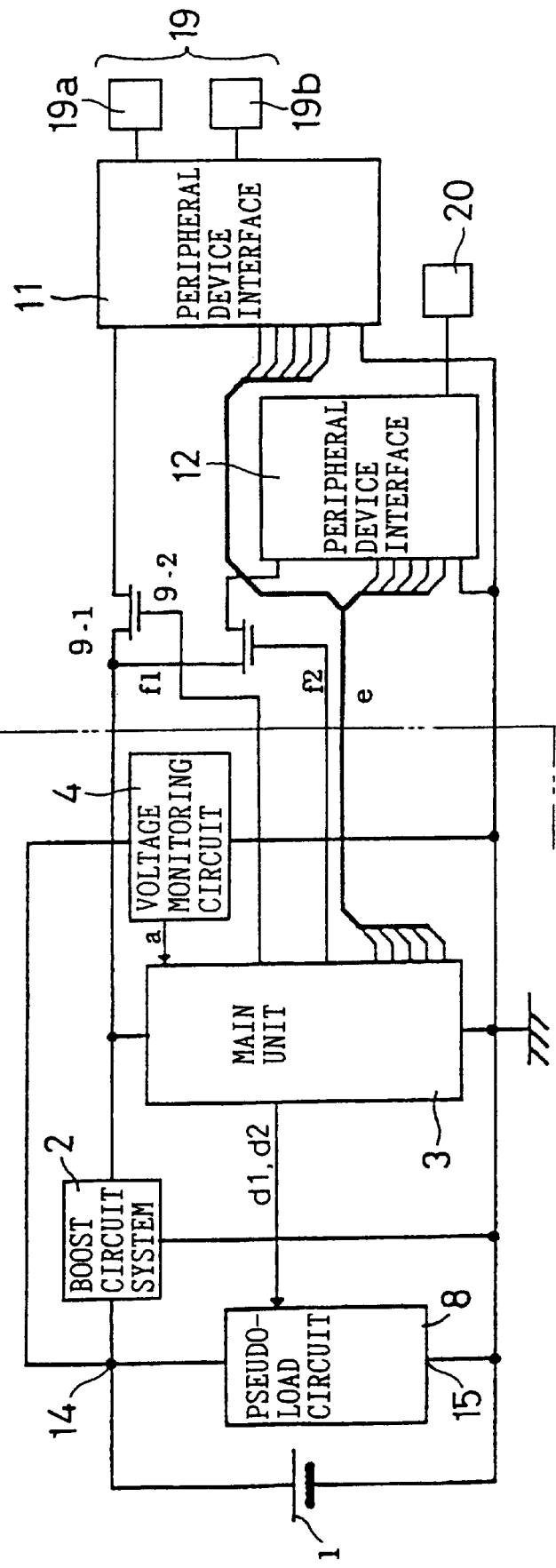
FIG. 14 is a block diagram of a system comprising the dummy-load circuit 8 of FIGS. 10 to 13 in the embodiment of the invention.

FIG. 14 is a block diagram showing the whole configuration of a system in which peripheral device interfaces 11 and 12 and peripheral devices 19 and 20 are connected to an electronic apparatus 17 of another embodiment of the invention incorporating the dummy-load circuit 8 shown in FIG. 10 or 12. The components corresponding to those of the above-described embodiments are designated by the same reference numerals. Also in the embodiment, when a current flows through the dummy-load circuit 8 and the voltage V of the battery 1 is equal to or lower than the voltage V0 which is the operating limit of the system main unit 3, the power supply to the peripheral devices 19 and 20 and the peripheral device interfaces 11 and 12 is stopped. The embodiment is different from the embodiments shown in FIGS. 1 to 9 in that the embodiment can cope with two peripheral devices 19 and 20 of different power consumption levels. The other configuration is the same as that shown in FIGS. 1 to 9.

The first peripheral device interface 11 to which the first peripheral device 19 of a light load is to be connected, and the second peripheral device interface 12 to which the second peripheral device 20 of a large and heavy load is to be connected are disposed. Switch elements 9-1 and 9-2 for selectively supplying the output of the boost circuit 2 to the peripheral device interfaces 11 and 12 are disposed. The switching elements 9-1 and 9-2 are selectively made conductive by control signals f1 and f2, respectively. Under the condition that the light load 19 is connected to the peripheral device interface 11, when it is detected by using the dummy load 8 that the voltage level of the battery 1 is equal to or higher than the predetermined value V0, the conductive state is caused by the detection signal f1. Under the condition that the heavy load 20 is connected to the peripheral device interface 12, when it is detected by using the dummy load that the voltage level V of the battery 1 is equal to or higher than the predetermined value V0, the conductive state is caused by the detection signal.

As described above, in the embodiment, the dummy load is weighted. In accordance with the state of the power source, i.e., the magnitude of a load which the power source can bear, the plural peripheral device interfaces 11 and 12 are stepwise restricted depending on the magnitude of the load.

Figure 15:
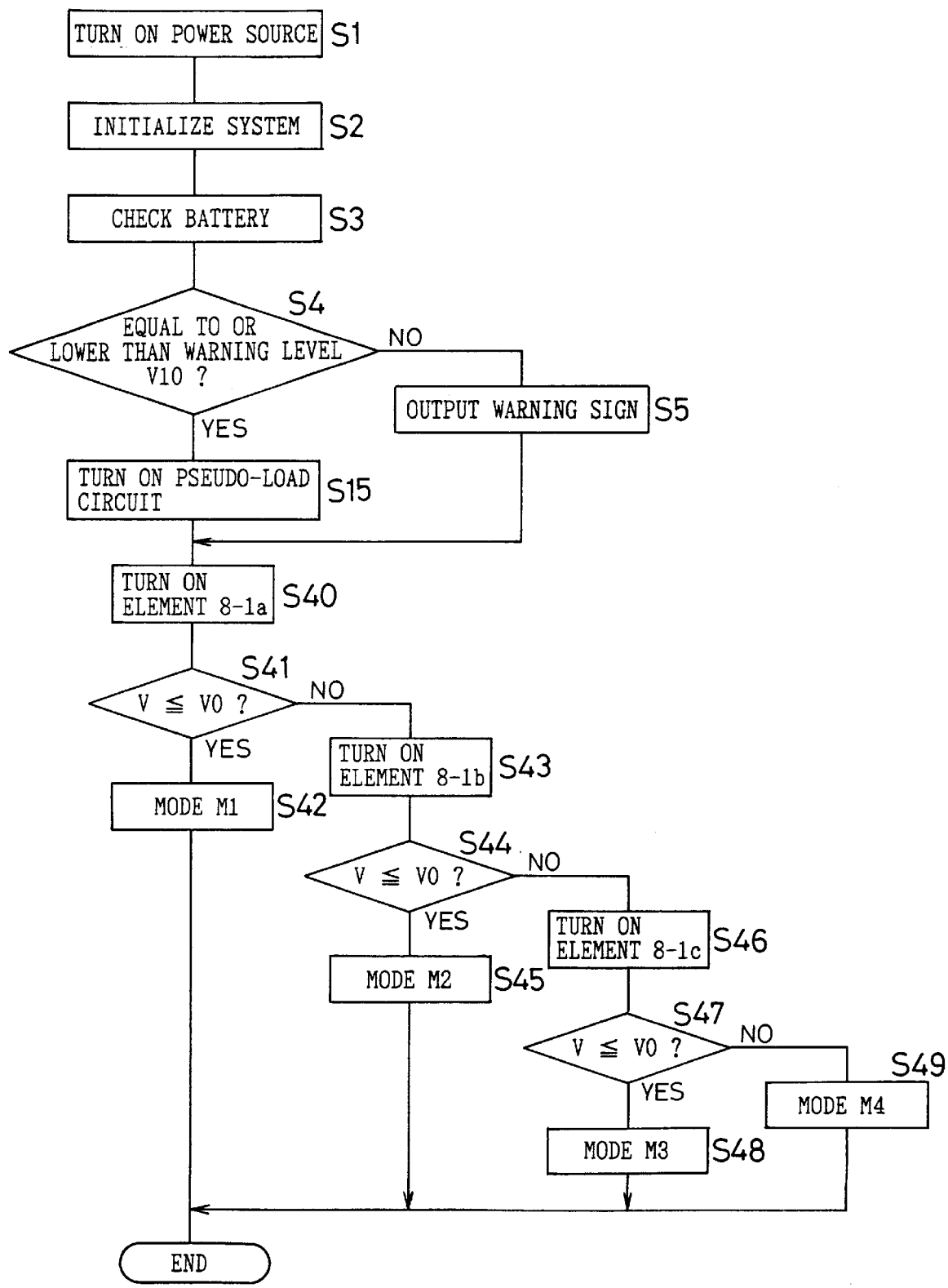
FIG. 15 is a flowchart illustrating the operation of the system of FIGS. 10 to 14.

FIG. 15 is a flowchart illustrating the operation of the processing circuit 3-1 disposed in the system main unit 3 of the apparatus shown in FIGS. 10 to 14. Steps S1 to S15 of FIG. 15 are the same as steps S1 to S15 of FIG. 5 in the embodiment described above. The operation of steps S15, and S40 to S49 is summarized in Table 1 below.

If expression 2 holds, the operation mode M12 is executed. In the operation mode M2, the switching element 9-1 is turned on in order to supply the power to the peripheral device interface 11. At this time, the processing circuit 3-1 of the system main unit 3 supplies the control signal through the line e so that, among the two peripheral devices 19a and 19b connected to the peripheral device interface 11, only the peripheral device 19a is powered and the other peripheral device 19b is not powered and enters the idle state. In this way, the power consumption for the battery 1 is suppressed.

If expression 2 does not hold at step S44 or V>V0, the process proceeds to subsequent step S46. In response to the control signals d1 and d2 from the system main unit 3, the decoder 8-4 produces at step S46 the gate signal dc1 so that the switching element 8-1c is conductive. As a result, the

TABLE 1

| PERIOD | SWITCHING ELEMENT | | | DUMMY LOAD | | | VOLTAGE OF BATTERY | SWITCHING ELEMENT | | SELECTION ACCORDING TO CONTROL SIGNAL e | | | OPERATION |
|---|---|---|---|---|---|---|---|---|---|---|---|---|---|
| (FIGS. 11 AND 13) | 8-1a | 8-1b | 8-1c | 8-2a | 8-2b | 8-2c | V | 9-1 | 9-2 | 19a | 19b | 20 | MODE |
| W1 | 1 | 0 | 0 | 1 | 0 | 0 | V ≦ V0 | 0 | 0 | 0 | 0 | 0 | M1 |
|  |  |  |  |  |  |  | V0 < V |  |  |  |  |  | M2 |
| W2 | 1 | 1 | 0 | 1 | 1 | 0 | V ≦ V0 | 1 | 0 | 1 | 0 | 0 |  |
|  |  |  |  |  |  |  | V < V0 |  |  |  |  |  | M3 |
| W3 | 1 | 1 | 1 | 1 | 1 | 1 | V ≦ V0 | 1 | 0 | 1 | 1 | 0 |  |
|  |  |  |  |  |  |  | V0 < V | 1 | 1 | 1 | 1 | 1 | M4 |

In Table 1, logic "1" in the columns of the switching elements 8-1a, 8-1b, and 8-1c, and 9-1 and 9-2 indicates the on state, and logic "0" the off state. In Table 1, logic "1" in the columns of the dummy loads 8-2a, 8-2b, and 8-2c indicates that the respective dummy loads are powered, and logic "0" that the respective dummy loads are not powered.

If, at step S4 of FIG. 15, the output voltage V of the battery 1 at the connecting point 16 is higher than the predetermined voltage level V10 or exceeds the battery replacement warning level V10, the system main unit 3 supplies in subsequent step S15 the control signals d1 and d2 to the dummy-load circuit 8.

In response to the control signals d1 and d2 from the system main unit 3, the decoder 8-4 produces at step S40 the gate signal da1 so that the switching element 8-1a is turned on. As a result, the voltage from the battery 1 is applied to the dummy load 8-2a and the power is supplied to the load. The voltage monitoring circuit 4 compares at step S41 the voltage V at the connecting point 16 with the predetermined reference voltage V0 and judges whether the following expression holds or not:

$$V \leq V0 \tag{1}$$

If expression 1 holds, the operation mode M1 is executed or both the switching elements 9-1 and 9-2 are maintained to be turned off.

If expression 1 does not hold at step S41 or V>V0, the process proceeds to subsequent step S43. In response to the control signals d1 and d2 from the system main unit 3, the decoder 8-4 produces at step S43 the gate signal db1 so that the switching element 8-1b is turned on. As a result, the power from the battery 1 is supplied to the dummy load 8-2b. The voltage monitoring circuit 4 compares the voltage V at the connecting point 16 with the reference voltage V0 and judges whether following expression holds or not:

$$V \leq V0 \tag{2}$$

power from the battery 1 is supplied to the dummy load 8-2c. The voltage monitoring circuit 4 judges at step S47 whether the voltage V at the connecting point 16 satisfies the following relationship or not:

$$V \leq V0 \tag{3}$$

If expression 3 holds, the operation mode M3 is executed. In the operation mode M3, the switching element 9-1 is made conductive by the control signal f1 from the system main unit 3 and the system main unit 3 supplies the control signal through the line e so that both the peripheral devices 19a and 19b are powered, thereby enabling the devices to operate.

If expression 3 does not hold at step S47 or V>V0, the operation mode M4 is executed. In the operation mode M4, the system main unit 3 produces the control signals f1 and f2 so that both the switching elements 9-1 and 9-2 are turned on. Therefore, the power is supplied to the peripheral device interfaces 11 and 12 so that the peripheral devices 19a and 19b, and 20 are powered, with the result that the devices enter the state where the operation is enabled. In the above, the dummy-load circuit 8 has the configuration of FIG. 12. In another embodiment of the invention, the dummy-load circuit 8 may have the configuration of FIG. 10. Also in the other embodiment, the invention is executed in the same manner. In the system main unit 3, the operation program in which, in response to the detection signal a from the voltage monitoring circuit 4, the on/off states of the switching elements 9-1 and 9-2 are controlled in accordance with the comparison results of expressions 1 to 3 wherein the detected voltage V at the connecting point 14 is compared with the reference voltage V0 is previously stored in the read-only memory 3-7 of the system main unit 3. The processing circuit 3-1 operates while reading out the stored contents of the read-only memory 3-7.

Figure 16:
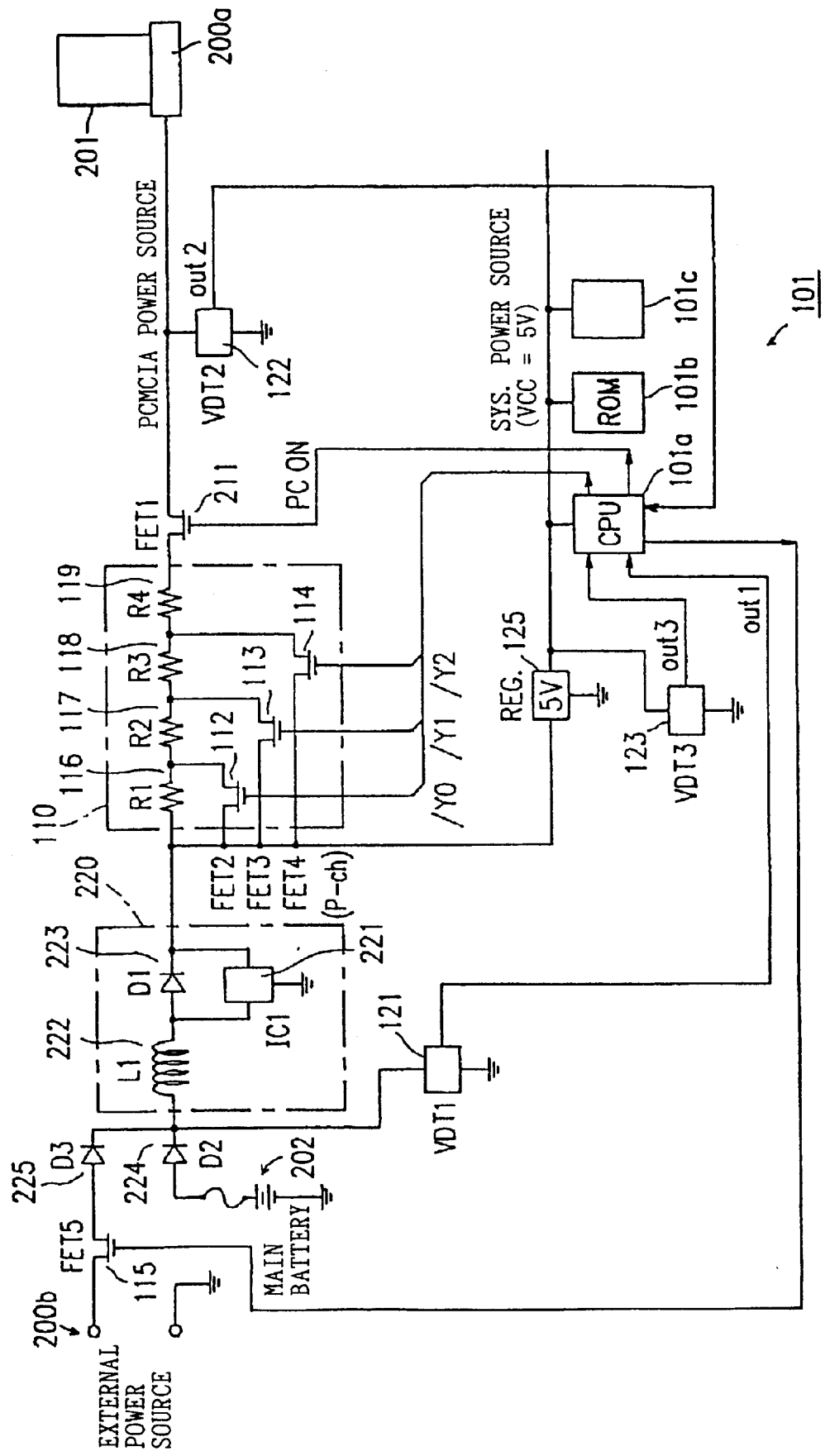
FIG. 16 is a diagram showing the circuit configuration of an electronic apparatus of Embodiment 4 of the invention in which the driving capacity of card driving means is digitally controlled.
Figure 17A:
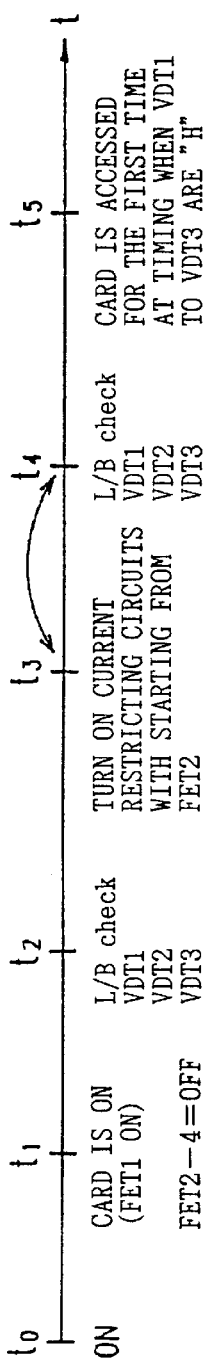
FIGS. 17A and 17B are diagrams showing the flow of a process of supplying a power source to a PCMCIA card attached to the electronic apparatus of Embodiment 4.
Figure 17B:
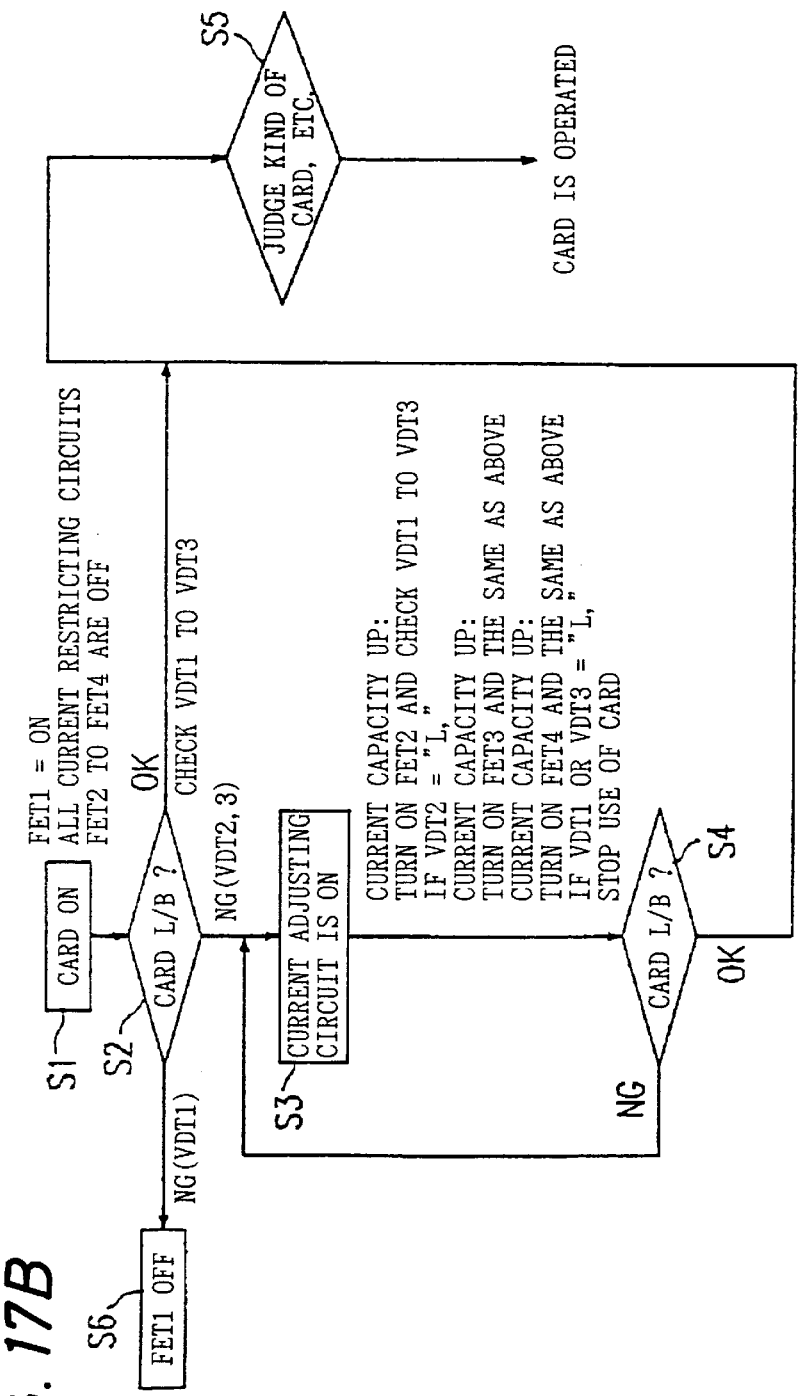
Figure 18:
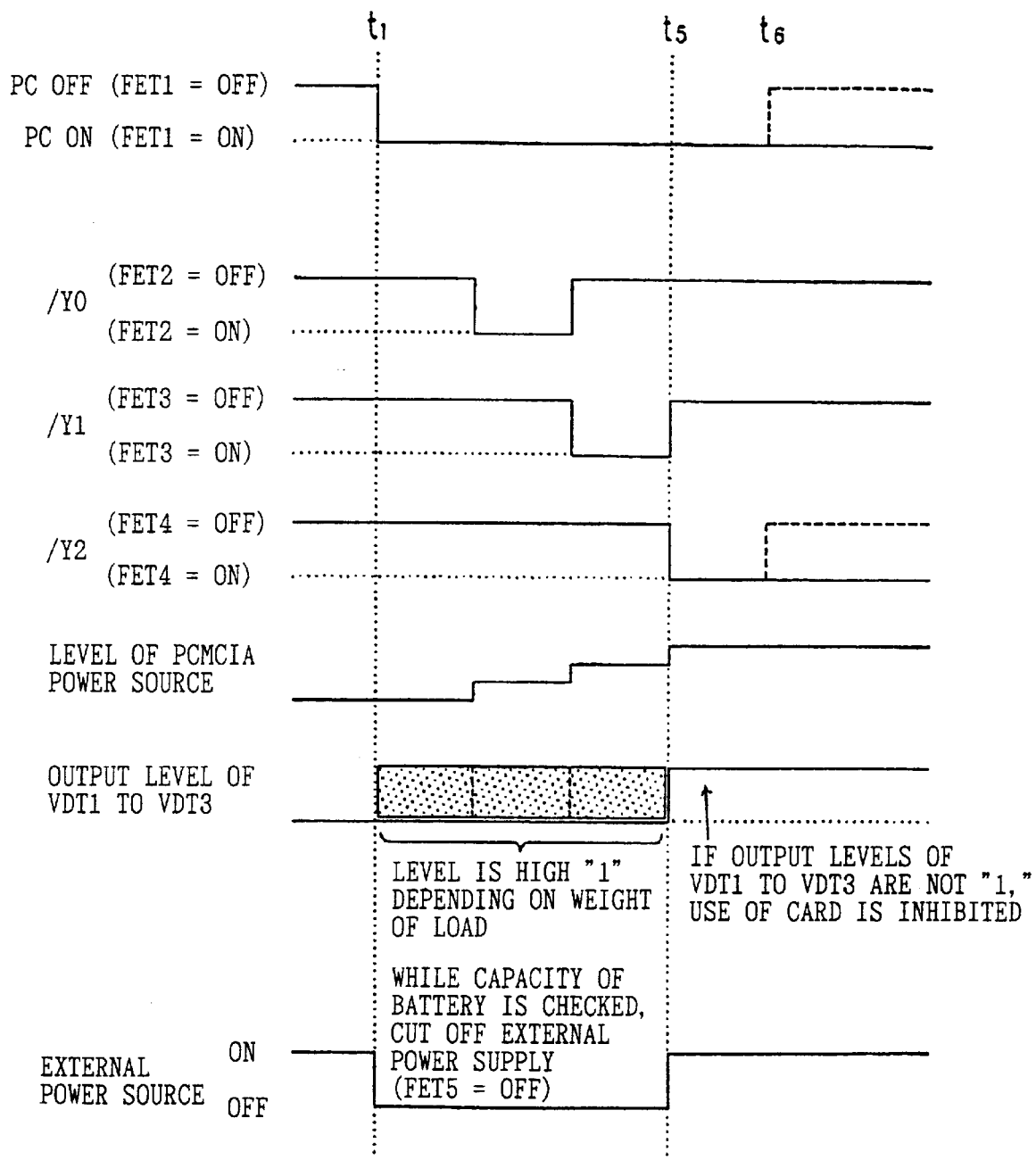
FIG. 18 is a diagram showing changes in signal levels at various portions in the electronic apparatus of Embodiment 4 when a power source is supplied to the PCMCIA card.

FIG. 16 is a diagram showing the circuit configuration of an electronic apparatus of Embodiment 1 of the invention, FIGS. 17A and 17B are diagrams showing the flow of a process of supplying a power source to a PCMCIA card attached to the electronic apparatus, and FIG. 18 is a diagram showing changes in signal levels at various portions in the electronic apparatus when a power source is supplied to the PCMCIA card.

The electronic apparatus 101 has an external power source terminal 200b to which an external power source is to be connected through an AC adaptor or the like, and is configured so as to incorporate a battery. The power supply to the PCMCIA card 201 can be performed also by a battery 202.

The electronic apparatus 101 comprises a CPU (Central Processing Unit) 101a which performs required calculation processes, a ROM (Read-Only Memory) 101b which stores programs for the calculation processes and the like, and another functional circuit 101c. These components are configured in the form of an LSI chip. The apparatus 101 further comprises boost circuits 220 and 125 which generate a voltage (5 V) required for operating the LSI chips such as the CPU 101a and the ROM 101b.

A diode (D3) 225 is forward connected between the external power source terminal 200b and the boost circuits 220, 125 and another diode (D2) 224 is forward connected between the battery 202 and the boost circuit 220.

The boost circuit 220 comprises a coil (L1) 222 one end of which is connected to the cathodes of the diodes 224 and 225, a diode (D1) 223 the anode of which is connected to the other end of the coil 222, and a power source IC 221 which is connected between the ends of the diode 223 and the ground.

The output of the boost circuit 220 is connected to the slot 200a through a switching element 211 composed of a field effect transistor FET1. When a power source switch of the electronic apparatus 101 is operated so that a processing circuit 101a is powered on, the gate input PC of the switching element 211 becomes the on-level of the transistor FET1 and the power is supplied to the PCMCIA card 201 through the switching element 211.

As the PCMCIA card, various kinds of cards ranging from a card of a small operation current such as a memory card to that of a large operation current such as a modem card or a disk card may be used.

The electronic apparatus 101 of Embodiment 1 comprises the slot 200a to which the PCMCIA card 201 is to be attached. The electronic apparatus 101 is configured in such a manner that, when the power supply is to be conducted on the PCMCIA card 201, the voltage of the power is gradually raised while checking the remaining capacity of the battery. The operation of gradually raising the voltage of the power supplied to the PCMCIA card 201 may be realized by executing one of the methods of digitally controlling the voltage and of controlling the voltage in an analog manner. In Embodiment 1, the configuration in which the voltage control is digitally conducted is employed.

The electronic apparatus 101 has the external power source terminal 200b to which an external power source is to be connected through an AC adaptor or the like, and is configured so as to incorporate two dry batteries as an internal power source. The power supply to the PCMCIA card 201 can be performed also by the battery 202. The electronic apparatus 101 comprises the CPU (Central Processing Unit) 101a which performs required calculation processes, the ROM (Read-Only Memory) 101b which stores programs for the calculation processes and the like, and the other functional circuit 101c. The apparatus 101 further comprises the boost circuit 220 which generates a voltage (5 V) required for operating the CPU 101a, the ROM 101b, etc. The CPU 101a, the ROM 101b, and the functional circuit 101c configure a calculation processing unit of the electronic apparatus and are configured in the form of an LSI chip.

In Embodiment 1, the electronic apparatus 101 further comprises: a first voltage detector (VDT1) 121 which receives the output voltage of the battery 202 and monitors the remaining capacity of the battery; a second voltage detector (VDT2) 122 which receives the power source voltage V supplied to the PCMCIA card 201 and monitors the voltage V; and a third voltage detector (VDT3) 123 which receives the power source voltage supplied to the LSI constituting the signal processing unit (system) of the electronic apparatus, such as the CPU 101a and the ROM 101b and monitors the voltage level. In the embodiment, the output voltage of the boost circuit 220 is supplied to the LSI constituting the signal processing unit (system) of the electronic apparatus, through a regulator 130 which limits the voltage level to 5 V. The detection outputs of the voltage detectors 121 to 123 are supplied to the CPU 101a. A switching element 115 composed of a field effect transistor (FET5) is connected between the external power source terminal 200b and the boost circuit 220. The switching element 115 interrupts the power supply from the external power source to the electronic apparatus in the state where the external power source is connected to the external power source terminal 200b. The real measurement of the remaining capacity of the battery is enabled when the switching element is turned off.

The electronic apparatus 101 of Embodiment 1 further comprises a current adjusting circuit 110 which digitally adjusts the power source voltage supplied to the PCMCIA card 201. The current adjusting circuit 110 comprises first to fourth resistors (R1 to R4) 116 to 119 which are connected in series between the switching element 211 and the boost circuit 220. The current adjusting circuit 110 further comprises: a switching element 112 which is connected in parallel with the first resistor 116; a switching element 113 which is connected in parallel with the first and second resistors 116 and 117; and a switching element 114 which is connected in parallel with the first to third resistors 116 to 118. The switching elements 112 to 114 of the current adjusting circuit 110 are configured by P-channel field effect transistors FET2 to FET4, respectively. The CPU 101a supplies the switching elements with control signals /Y0, /Y1, and /Y2 for controlling the on/off operation of the switching elements.

Next, the operation of the apparatus will be described.

First, the operations of the first to third voltage detectors 121 to 123 will be described.

The voltage generated by the battery 202 is supplied to the first voltage detector 121, the power source voltage supplied to the PCMCIA card is supplied to the second voltage detector 122, and the power source voltage supplied to the LSI constituting the system such as the CPU is supplied to the third voltage detector 123.

When the input voltage is higher than a preset reference voltage, each of the voltage detectors 121 to 123 outputs a signal of "1" level, and, when the input voltage is lower than the reference voltage, outputs a signal of "0" level.

For example, the reference voltage of the first voltage detector 121 is set to be 2.5 V. In this case, when dry batteries are used as the battery, the output voltage of the battery at the initial stage of the use is 3 V (=1.5×2). At this timing, therefore, the output voltage of the first voltage detector 121 has "1" level. It is assumed that the electronic apparatus is somewhat used and the voltage generated by the battery becomes 2.4 V (=1.2×2). At this timing, the output of the first voltage detector 121 is changed to "0" level.

Next, the case where, when the power source voltage is to be supplied to the PCMCIA card, the operation of gradually raising the supplied voltage is realized by a method of conducting a digital on/off control on the FETs constituting the current adjusting circuit 110 will be described with reference to FIGS. 17A, 17B, and 18.

As shown in FIG. 17A, for example, the power source of the electronic apparatus 101 is turned on at timing t (=$t_0$). When the PCMCIA card 201 is to be driven, the PCMCIA card 201 is attached to the slot 200a. Then the CPU lla detects from a signal supplied from a sensor which is not shown that the PCMCIA card is attached. At timing t (=$t_1$), the switching element 211 is turned on while maintaining the switching elements 112 to 114 to be turned off, so that the card 201 is powered (step S1). If the electronic apparatus 101 is powered by an external power source, the switching element 115 is turned off so that the power supply from the external power source is cut off, whereby the apparatus is powered only by the battery.

At this timing, the resistance of the current adjusting circuit 110 is the maximum value of (R1+R2+R3+R4), and hence the amount of the current which flows into the PCMCIA card 201 per unit time, (i.e., the power supply capacity) is minimum.

The CPU 101a conducts at timing t (=t2) judgment on the output voltage levels of the voltage detectors 121 to 123 (step S2). Specifically, the CPU 101a first conducts judgment on the output voltage level of the first voltage detector 121. If the output voltage level is "1" level or the voltage generated by the battery is higher than the preset reference voltage, the CPU 101a conducts judgment on the output voltage levels of the second and third voltage detectors 122 and 123. If the output voltage levels of all the detectors are "1" level, it is judged that the battery has a capacity required for driving the PCMCIA card, and the CPU 101a enables the use of the card 201. Data access between the PCMCIA card 201 and the electronic apparatus 101 is not enabled until this judgment is done. The CPU 101a judges the kinds of the card, and the like (step S5), and allows the card to conduct a predetermined process.

By contrast, if the result of the judgment at step S2 shows that the output voltage level of the first voltage detector 121 is "0" level, the CPU 101a determines that the battery capacity is insufficient, and turns off the switching element 211 (step S6). Then the process of supplying the power to the card is ended. As described above, the amount of the current required for driving a PCMCIA card is varied depending on the kind of the card. At this timing, therefore, the card can be judged to be available or unavailable.

If the result of the judgment at step S2 shows that the output voltage level of the first voltage detector 121 is "1" level and that of the second voltage detector 122 is "0" level, the CPU 101a conducts during the period from timing $t_3$ to timing $t_4$ an adjusting operation using the current adjusting circuit 110 (step S3), and then conducts a judging process after the adjustment (step S4).

At step S3, the CPU 101a turns on the switching element 112 of the current adjusting circuit 110, and conducts judgment on the output voltage levels of the first and second voltage detectors 121 and 122. When the switching element 112 is turned on, the resistor 116 is short-circuited through the switching element 112, with the result that the capacity of the electronic apparatus 101 for supplying the power to the PCMCIA card 201 is enhanced. Thereafter, the output voltage levels of the voltage detectors 121 to 123 are judged (step S4). If the result of the judgment shows that all the output voltage levels of the voltage detectors 121 to 123 are "1" level, the process of the CPU 101a proceeds to step S5. Thereafter, data access between the electronic apparatus and the PCMCIA card is enabled.

If any of the output voltage levels of the voltage detectors 121 to 123 is not "1" level at the timing when the switching element 112 is turned on, the CPU 101a repeats the process of steps S3 and S4 until all the output voltage levels of the voltage detectors are "1" level. Specifically, after the switching element 112 is turned on, judgment is then conducted on the output voltage levels of the voltage detectors while the switching element 112 is turned off and the switching element 113 is turned on. If any of the output voltage levels of the voltage detectors 121 to 123 fails to be "1" level, judgment is conducted on the output voltage levels of the voltage detectors while the switching element 113 is turned off and the switching element 114 is turned on.

If all the output voltage levels of the voltage detectors 121 to 123 are "1" level at the timing when the switching element 113 or 114 is turned on, the CPU 101a judges at this timing that the PCMCIA card can be used. The process of the CPU 101a proceeds to step S5. Thereafter, at timing t (=$t_5$), data access between the electronic apparatus and the PCMCIA card is enabled. In the case where an external power source is connected to the electronic apparatus 101, the switching element 115b is turned on at this timing so that the external power source and the incorporated battery are jointly used.

If, even after the switching element 114 is finally turned on at timing t (=$t_5$), any of the output voltage levels of the voltage detectors 121 to 123 fails to be "1" level, the CPU 101a judged that this card requires a current which exceeds the load driving capacity of the battery, and then turns off at timing t (=$t_6$) the switching elements 211 and 114 so that the use of the card is rejected.

As described above, in Embodiment 1, when the power is to be supplied to the PCMCIA card attached to the electronic apparatus, the capacity of supplying the power to the card is gradually increased. Therefore, the voltage fluctuation due to an inrush current when the card is connected to the power source can be suppressed, thereby preventing the apparatus from malfunctioning.

In Embodiment 1, during the process of increasing the power supply capacity, the output voltage levels of the voltage detectors are monitored. In the course of increasing the power supply capacity, therefore, the CPU can detect the lack of the battery capacity or the lowering of the power source voltage of the LSI constituting the system, on the basis of the output voltage levels of the first and third voltage detectors. Consequently, the switching element 211 can be turned off even in the course of increasing the power supply capacity.

According to this configuration, in the case where a card requiring a current exceeding the capacity of the battery is connected, it is possible to prevent a phenomenon that, during the process of adjusting the current supply capacity, the power source voltage of the LSI constituting the system such as the CPU is lowered to be equal to or lower than the present voltage and the apparatus malfunctions, from occurring.

In the embodiment, in the case where an AC adaptor is connected to the electronic apparatus and an external power source is supplied to the electronic apparatus, when the output voltage levels of the voltage detectors are to be judged, the switching element 115 is turned off so that the supply of the external power source is cut off. Even in the case where an AC adaptor is connected to the electronic apparatus, therefore, it is possible to know the real remaining capacity of the battery. Accordingly, the apparatus can be configured so that, only when the battery has a sufficient capacity, the driving of the PCMCIA card can be enabled. According to this configuration, even when the external power supply is stopped during the use of the card, the power source supply from the battery can cope with the stop of the external power supply, and a maloperation of the apparatus which may be caused by reduction of the power source voltage of the LSI constituting the system such as the CPU can be prevented from occurring.

In Embodiment 1 described above, the configuration for gradually raising the voltage of the power supplied to the PCMCIA card 201 is realized by executing the method of digitally controlling the voltage. Alternatively, the configuration may be realized by controlling the voltage in an analog manner. In Embodiment 2 described below, the configuration for gradually raising the voltage of the power supplied to the PCMCIA card 201 is realized by an analog voltage control.

(Embodiment 2)

Figure 19A:
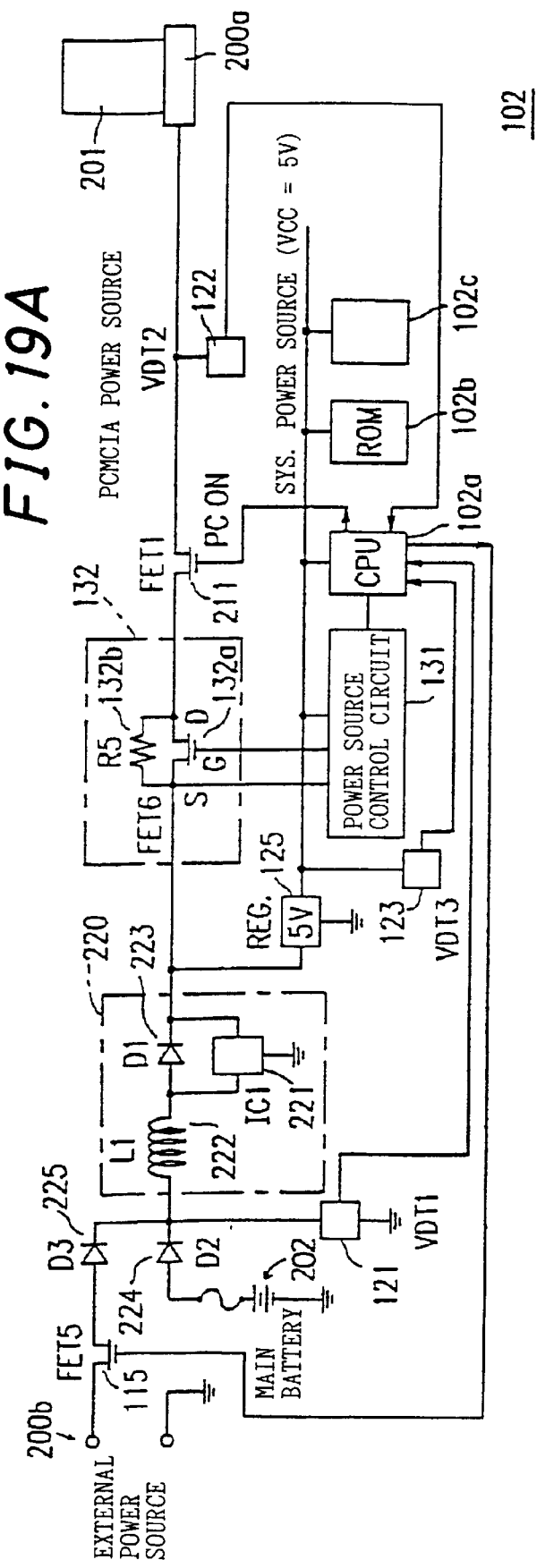
FIGS. 19A and 19B are diagrams illustrating the configuration of an electronic apparatus of Embodiment 5 of the invention in which the driving capacity of card driving means is controlled in an analog manner.
Figure 19B:
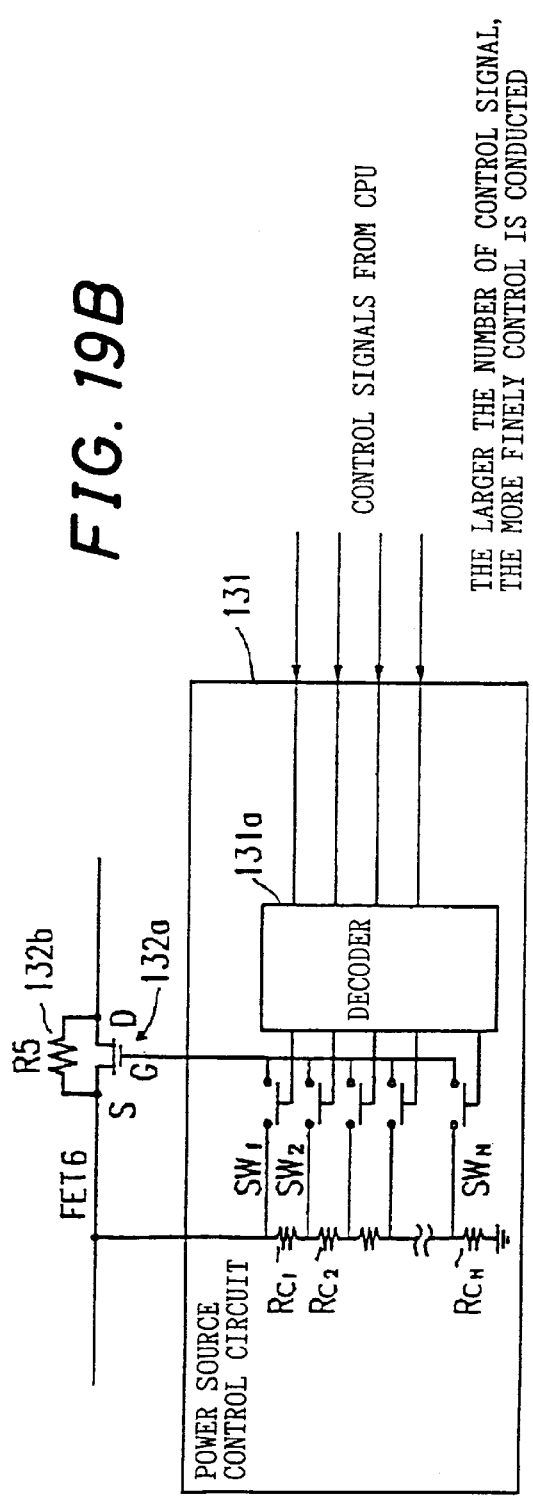

FIGS. 19A and 19B are diagrams illustrating the configuration of an electronic apparatus of Embodiment 2 of the invention. In the figure, the same reference numerals as those of FIG. 16 designate components identical with those of the electronic apparatus 101 of Embodiment 1. The electronic apparatus 102 comprises a CPU 102a, a ROM 102b, and another functional circuit 102c. In the same manner as the electronic apparatus 101 of Embodiment 1, the apparatus 102 further comprises the slot 200a to which the PCMCIA card 201 is to be attached. The electronic apparatus 102 is configured in such a manner that, when the power supply is to be conducted on the PCMCIA card 201, the voltage of the power is gradually raised in an analog manner while checking the remaining capacity of the battery.

In place of the digital current adjusting circuit 110 of the electronic apparatus 101 of Embodiment 1, the electronic apparatus 102 of Embodiment 2 comprises an analog current adjusting circuit 132, and a power control circuit 131 which controls the circuit 132 in accordance with a control signal from the CPU 102a.

The analog current adjusting circuit 132 is connected between the boost circuit 220 and the switching element 211, and consists of a field effect transistor (FET6) 132a in which the driving capacity can be adjusted in accordance with the gate input, and a resistor (R5) 132b which is connected in parallel with the transistor 132a.

The characteristics of the transistor 132a will be briefly described. When a potential difference is produced between the gate and the source, the transistor 132a is turned on or the source-drain is conductive. However, the on resistance is varied in accordance with the degree of the potential difference between the gate and the source. The resistor R5 is used for making the relationship between the source-drain potential difference and the value of the on resistance closer to a linear one.

The power control circuit 131 comprises: N resistors $Rc_1$, $Rc_2$, ..., and $Rc_N$ which are connected in series between the terminal (source) of the transistor 132a on the side of the boost circuit 220 and the ground; a decoder 131a which decodes the control signal from the CPU 102a and outputs N decoder signals; and first to N-th switches $SW_N$ which are subjected to the on/off control by the decoded output of the decoder.

The first switch $SW_1$ bridges or opens the source and the drain of the transistor 132a, and the switches $SW_2$, $SW_3$, ..., and $SW_N$ respectively bridge or open the nodes of the resistors $Rc_2$, $Rc_3$, ..., and $Rc_{N-1}$ and the resistors $Rc_3$, $Rc_4$, ..., and $Rc_N$, and the gate of the transistor 132a.

Figure 20A:
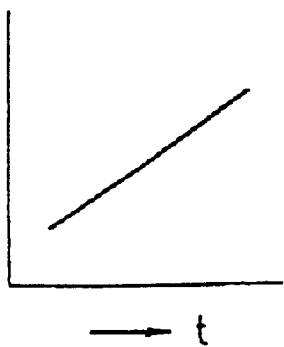
FIGS. 20A, 20B and 20C are views illustrating the operation of the card driving means of Embodiment 5.
Figure 20B:
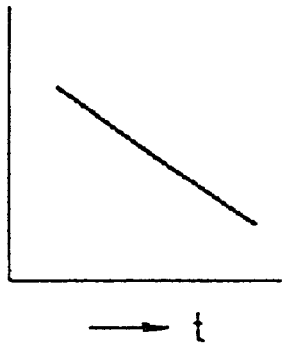
Figure 20C:
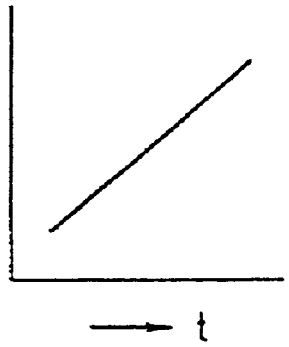
Figure 21:
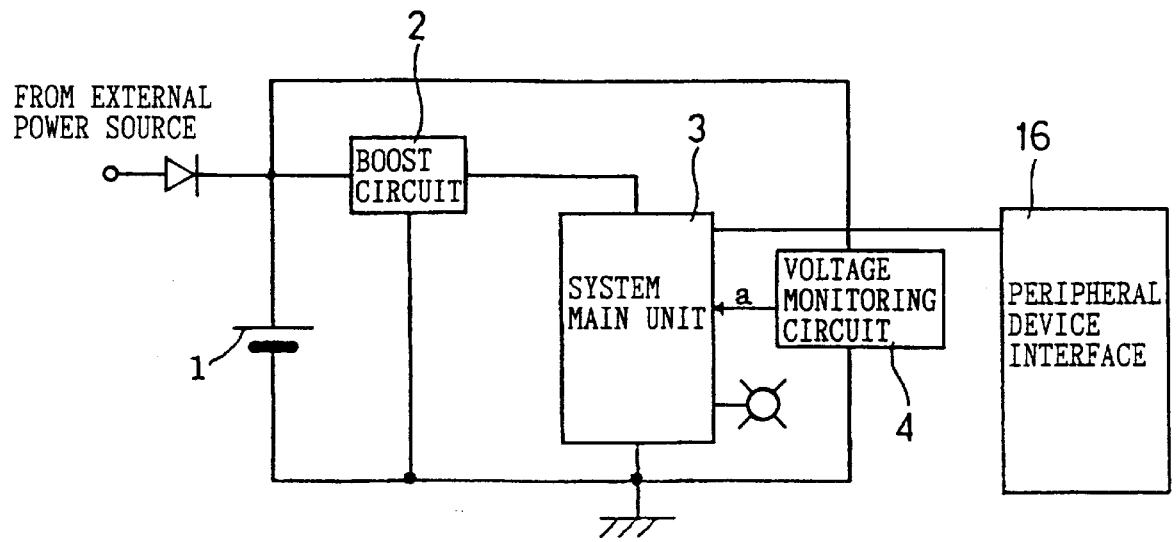
FIG. 21 is a block diagram of the basic configuration of a prior art embodiment.
Figure 22:
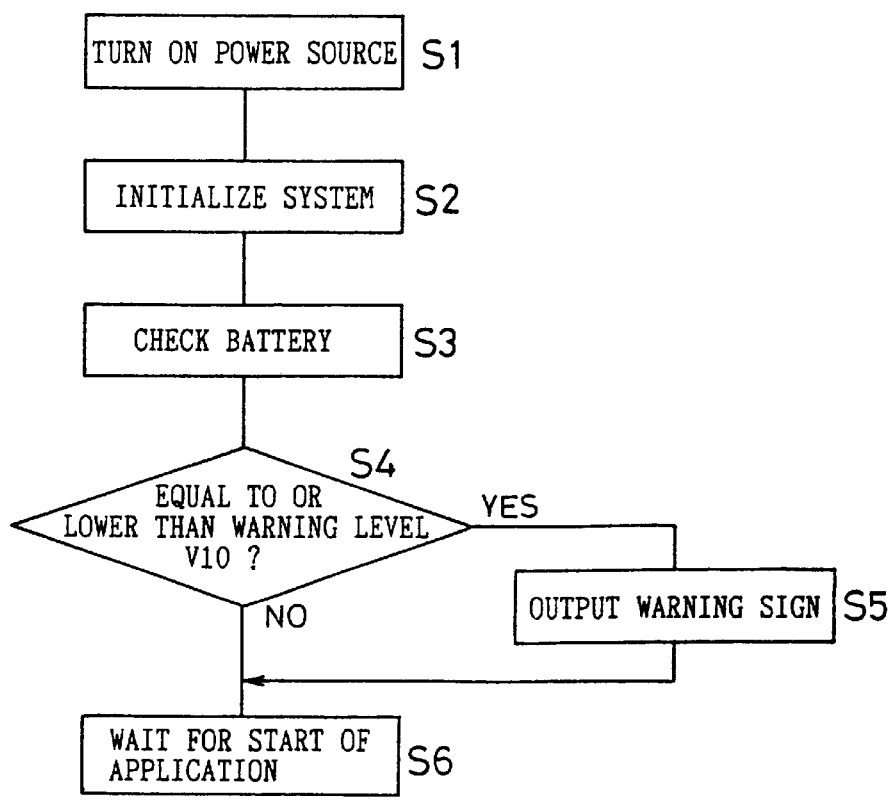
FIG. 22 is a flowchart illustrating the operation at activation of a system of the prior art embodiment shown in FIG. 21.
Figure 23:
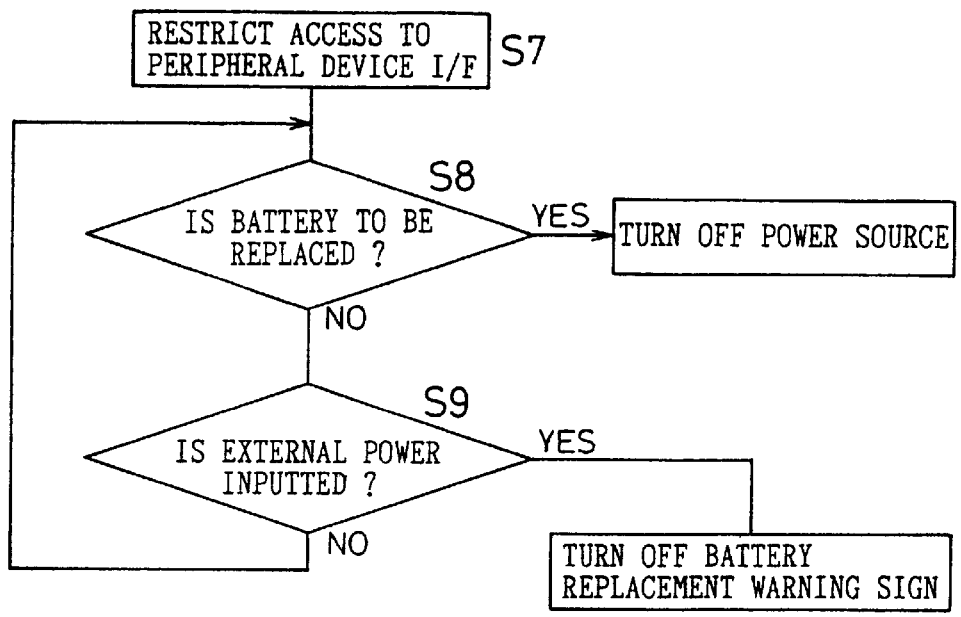
FIG. 23 is a flowchart illustrating a process of improving a power source state in the prior art embodiment shown in FIG. 21.
Figure 24:
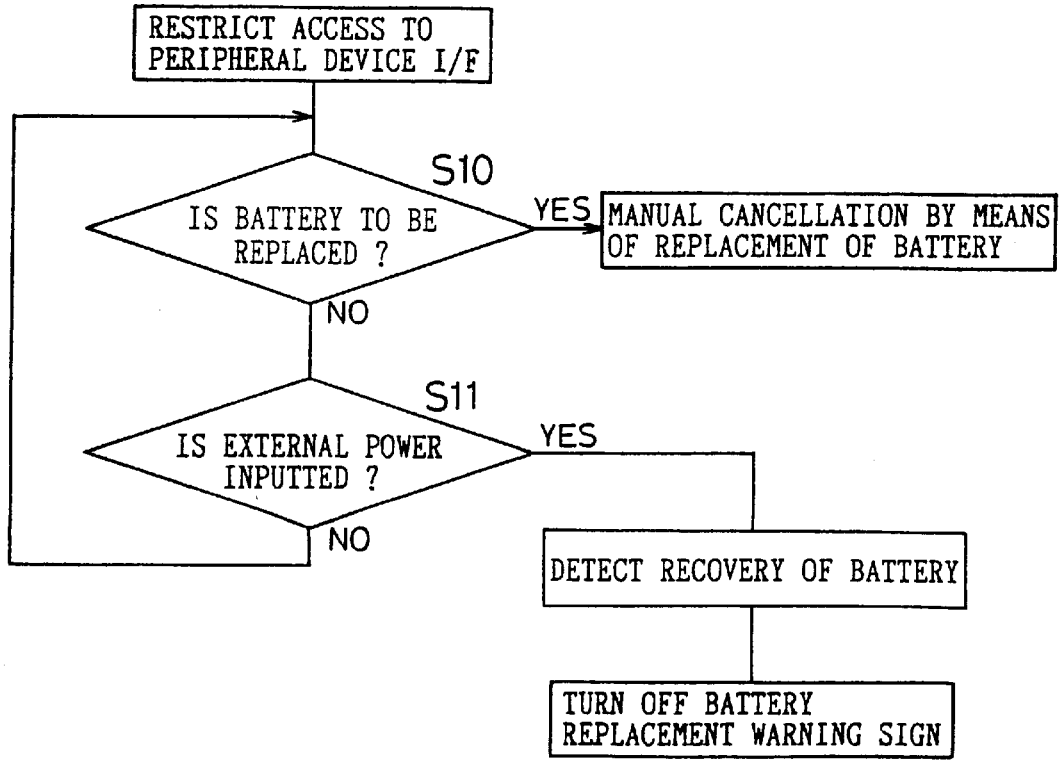
FIG. 24 is a flowchart illustrating a process of recovering the power source state in the prior art embodiment shown in FIG. 21.
Figure 25:
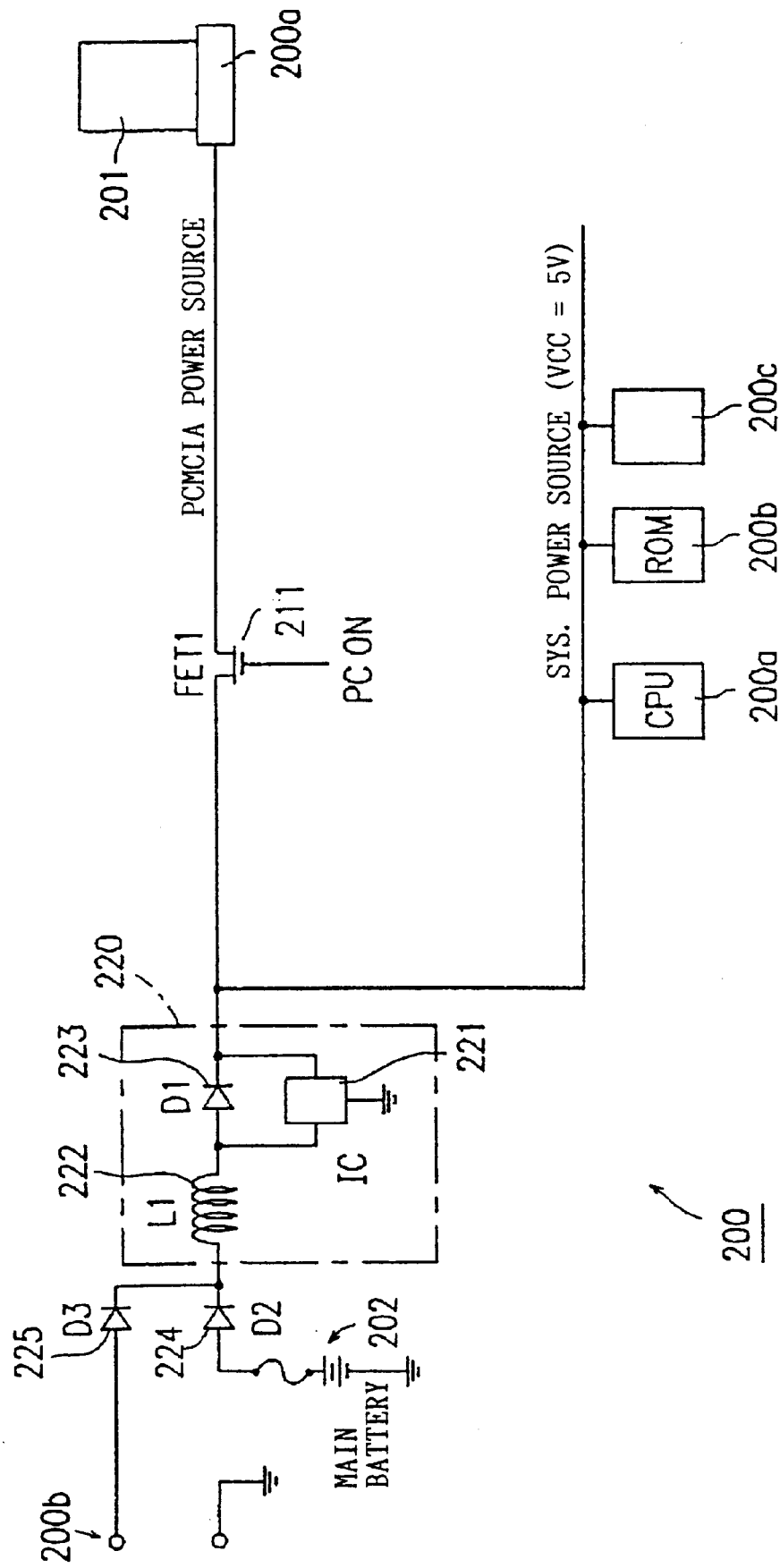
FIG. 25 is a circuit diagram illustrating a prior art electronic apparatus to which a PCMCIA card can be attached.

Next, the operation of the apparatus will be described with reference to FIGS. 20A, 20B and 20C.

When a PCMCIA card is to be driven, the card is attached to the slot 200a. First, the CPU 102a turns on the transistor 211 so that the power is supplied to the PCMCIA card. At this time, the current adjusting transistor 132a is in the off state. In other words, the switch $SW_1$ is turned on and the gate and the source of the transistor have the same potential. Therefore, the resistance between the boost circuit 220 and the switching element 211 consists of only the resistor R1, with the result that the power supply capacity is minimum.

Under this state, the output voltage level of the first voltage detector 121 is judged. If the voltage level is "1" level, the output voltage levels of the second and third voltage detectors 122 and 123 are judged. By contrast, if the output voltage level of the first voltage detector 121 is "0" level, the CPU 102a determines that the battery capacity is insufficient, and turns off the switching element 211.

If all the output voltage levels of the detectors 121 to 123 are "1" level, the CPU 102a determines that the battery has a sufficient capacity and enables the use of the card. As described above, the amount of the current required for driving a card is varied depending on the kind of the card. At this timing, therefore, the card can be judged to be available or unavailable. The embodiment is identical in this point with the electronic apparatus 101 of Embodiment 1 which uses the digital current adjusting circuit.

The on/off states of the switches $SW_1$ to $SW_N$ are controlled by the decoded output of the decoder 131a which receives the control signal from the CPU 102a. The potential difference between the gate and the source of the current adjusting transistor 132a can be gradually increased by sequentially turning on the switches $SW_{1 \ to \ SWN}$ (see FIG. 20A). As the potential difference becomes larger, the on resistance between the source and the drain of the transistor 132a is gradually reduced (see FIG. 20B), and the voltage drop between the source and the drain is gradually reduced. In other words, the capacity of supplying the power to the PCMCIA card by the current adjusting circuit 132 is gradually enhanced (see FIG. 20C).

If the output voltage level of the voltage detector 121 is "1" level and that of the second voltage detector 122 is "0" level, the switch which is to be turned on is sequentially changed in the sequence of the switches $SW_2$, $SW_3$, ..., and $SW_N$. Each time when the change is done, the same judgment as that described above is conducted on the output voltage levels of the voltage detectors 121 to 123.

At the timing when all the output voltage levels of the detectors 121 to 123 are "1" level, the use of the card is enabled. If, even after the N-th switching element $SW_N$ is turned on, any of the output voltage levels of the voltage detectors 121 to 123 fails to be "1" level, the CPU 102a judged that this card requires a current which exceeds the load driving capacity of the battery, and rejects the use of the card.

In Embodiment 2, when the resistors and the switching elements of the power control circuit are increased in number, the capacity of driving a PCMCIA card can be enhanced more smoothly.

The invention may be embodied in other specific forms without departing from the spirit or essential characteristics thereof. The present embodiments are therefore to be considered in all respects as illustrative and not restrictive, the scope of the invention being indicated by the appended claims rather than by the foregoing description and all changes which come within the meaning and the range of equivalency of the claims are therefore intended to be embraced therein.

What is claimed is:

1. An electronic apparatus comprising:
a battery power source for supplying power to the electronic apparatus, the electronic apparatus being connected to the battery power source as a nominal load for the battery power source;
a voltage monitor for detecting when an output voltage of the battery power source is lowered to a predetermined reference voltage or less;
a dummy load;
a controller which initiates a load operation which determines whether an additional load having a magnitude of the dummy load can also be connected to the power source when the electronic apparatus is powered on and supplied power by the battery power source;
a switch which, upon initiation of the load operation by the controller, selectively includes the dummy load in the load operation; and
wherein the output voltage of the battery power source as detected by the voltage monitor enables the controller to determine during the load operation whether the additional load having the magnitude of the dummy load can be connected to the battery power source when the electronic apparatus is powered on.

2. The electronic apparatus of claim 1, wherein
the dummy load comprises a plurality of dummy loads;
the switch selectively connects the respective dummy loads to the battery power source;
the voltage monitor detects the output voltage of the battery power source when the respective dummy loads are connected to the battery power source; and
the controller derives a signal for selecting a load for connection to the battery power source, the signal being related to the output voltage of the battery power source with respect to each dummy load, as detected by the voltage monitor.

3. The electronic apparatus of claim 2, the apparatus further comprising:
a plurality of peripheral device interfaces which are coupled to the electronic apparatus through a signal line comprising an address line and a data line;
wherein during the load operation the controller determines with respect to each of the peripheral device interfaces whether corresponding peripheral devices can be connected to the peripheral device interfaces and thereby comprise the additional load without lowering the output voltage of the battery power source to a predetermined voltage or less, and wherein the controller operates to supply a voltage from the battery power source to the peripheral device interfaces as determined by the controller.

4. The electronic apparatus of claim 1, wherein the additional load is a peripheral device, the apparatus further comprising:
a peripheral device interface which is coupled to the electronic apparatus through a signal line comprising an address line and a data line;
wherein when, during the load operation, the controller determines that the peripheral device can be connected to the peripheral device interface, the controller operates to supply a voltage from the battery power source to the peripheral device.

5. The electronic apparatus of claim 1, wherein after both
(1) the controller had determined that the voltage supplied from the battery power source was insufficient for driving the additional load, and
(2) the controller thereafter determines that sufficient voltage for driving the additional load has been restored,
the controller automatically connects the additional load to the battery power source.

6. An electronic apparatus with a card-like electronic part on which an electronic circuit is mounted, the electronic apparatus comprising:
battery which is disposed as a power source;
a battery remaining capacity detector for detecting a remaining capacity of the battery; and
a card driver powered by the battery and driving the card-like electronic part;
wherein a driving capacity of the card driver is gradually increased in accordance with a detection output from the battery remaining capacity detector.

7. The electronic apparatus of claim 6, wherein the card driver comprises a field effect transistor, and wherein a gate voltage of the field effect transistor is controlled in accordance with the detection output of the battery remaining capacity detector, thereby adjusting the driving capacity of the card-like electronic part.

8. The electronic apparatus of claim 6, further comprising a controller which receives the detection output of the battery remaining capacity detector and which, when the remaining capacity ot the battery is equal to or lower than a predetermined value, interrupts the power supply from the battery to the card-like electronic part.

9. The electronic apparatus of claim 6, the apparatus further comprising:
a functional circuit, powered by the battery, which conducts signal processing;
a power source level detector for detecting a level of power supplied to an LSI chip on which the functional circuit is mounted; and
a controller which receives a detection output from the power source level detector, and which when the level of the power source supplied to the LSI chip is equal to or lower than a predetermined value, interrupts the power supply from the battery to the card-like electronic part.

10. The electronic apparatus of claim 6, the apparatus further comprising:
a circuit configuration which supplies a power from a power source outside the apparatus to portions inside the apparatus, in addition to a circuit configuration which supplies a power from the battery to the portions inside the apparatus, and
a switch circuit which is disposed between the power source outside the apparatus and the portions inside the apparatus,
wherein, when the detection of the remaining capacity of the battery is conducted by the battery remaining capacity detector, the switch circuit interrupts the power supply from the power source outside the apparatus to the portions inside the apparatus.

11. An electronic apparatus comprising:
a battery power source connected to supply power to the electronic apparatus and for which the electronic apparatus serves as a nominal load;

a voltage monitoring circuit which detects when an output voltage of the battery power source falls below a predetermined reference voltage;

a pseudo-load circuit which includes a switch and a dummy load;

a controller which, in response to the voltage monitoring circuit, conducts a load operation wherein the switch of the pseudo-load circuit connects the dummy load to the battery power source whereby the battery power source supplies power both to the nominal load and to the dummy load, and wherein on the basis of the output voltage of the battery power source when both the nominal load and the dummy load are connected to the battery power source, the controller determines whether to allow a further load to drain the battery power source.

12. The electronic apparatus of claim 11, wherein the controller determines whether to allow connection of a peripheral device interface to the battery power source.

13. The electronic apparatus of claim 12, wherein the peripheral device interface is a PCMCIA card.

14. The electronic apparatus of claim 11, wherein the pseudo-load circuit has plural dummy loads which are selectively invoked to determine for which of plural possible loads the battery power source supplies sufficient power.

15. The electronic apparatus of claim 14, wherein the plural possible loads are plural peripheral devices.

16. The electronic apparatus of claim 11, wherein the controller allows a further drain on the battery power source until an inrush current is detected.

17. The electronic apparatus of claim 11, wherein the electronic apparatus is a personal digital assistant.

* * * * *